US012632471B2

(12) United States Patent
Brown et al.

(10) Patent No.: US 12,632,471 B2
(45) Date of Patent: May 19, 2026

(54) QUERY CLARIFICATION BASED ON CONFIDENCE IN A CLASSIFICATION PERFORMED BY A GENERATIVE LANGUAGE MACHINE LEARNING MODEL

(71) Applicant: SHOPIFY INC., Ottawa (CA)

(72) Inventors: Vesna Brown, Manotick (CA); Maxwell Dayvson Da Silva, Brooklyn, NY (US); David Wurtz, Paradise Valley, AZ (US); Alexandre Salle, Porto Alegre (BR); Christopher Bullock, Wellington (CA)

(73) Assignee: SHOPIFY INC., Ottawa (CA)

( * ) Notice: Subject to any disclaimer, the term of this patent is extended or adjusted under 35 U.S.C. 154(b) by 6 days.

(21) Appl. No.: 18/785,135

(22) Filed: Jul. 26, 2024

(65) Prior Publication Data

US 2025/0363158 A1 Nov. 27, 2025

Related U.S. Application Data

(60) Provisional application No. 63/650,608, filed on May 22, 2024.

(51) Int. Cl.
| | |
|---|---|
| *G06F 16/20* | (2019.01) |
| *G06F 16/2455* | (2019.01) |
| *G06F 16/28* | (2019.01) |
| *G06F 16/334* | (2025.01) |
| *G06F 16/353* | (2025.01) |
| *G06F 30/27* | (2020.01) |
(Continued)

(52) U.S. Cl.
CPC ........ *G06F 16/285* (2019.01); *G06F 16/2455* (2019.01); *G06F 16/3346* (2019.01);
(Continued)

(58) Field of Classification Search
CPC .... G06F 16/3346; G06F 16/353; G06F 30/27; G06F 40/10; G06F 40/216; G10L 15/18; G10L 15/183
See application file for complete search history.

(56) References Cited

U.S. PATENT DOCUMENTS

| | | | |
|---|---|---|---|
| 12,298,975 B2 | 5/2025 | Baldua et al. | |
| 2018/0096058 A1* | 4/2018 | Anderson | G06F 16/35 |
(Continued)

FOREIGN PATENT DOCUMENTS

| | | | |
|---|---|---|---|
| WO | 2023278070 A1 | 1/2023 | |
| WO | WO-2024015321 A1 * | 1/2024 | G06N 5/022 |

OTHER PUBLICATIONS

Gautam Chutani, "Unlocking LLM Confidence Through Logprobs", Medium, https://gautam75.medium.com/unlocking-llm-confidence-through-logprobs-54b26ed1b48a, Feb. 18, 2024, pp. 1 to 18.
(Continued)

*Primary Examiner* — Diedra McQuitery

(57) ABSTRACT

A large language model (LLM) may be used to classify an input into one of a plurality of categories. However, given the machine-learning operation of the LLM, the output of the LLM does not represent a definitive statement, but is based on probability computations of the machine learning model. Therefore, the classification performed by the LLM might not be correct. Classification into the wrong category by the LLM results in downstream technical problems. In some implementations, when an LLM generates a response that classifies an input, one or more probability values associated with a token that forms the basis of the response may be used to determine a confidence value. The confidence value is indicative of confidence in the classification performed by the LLM. An action may be taken based on the confidence value.

20 Claims, 9 Drawing Sheets

(51) Int. Cl.

| | | |
|---|---|---|
| *G06N 3/08* | (2023.01) | |
| *G06F 40/10* | (2020.01) | |
| *G06F 40/216* | (2020.01) | |
| *G10L 15/18* | (2013.01) | |
| *G10L 15/183* | (2013.01) | |

(52) U.S. Cl.

CPC ............ *G06F 16/353* (2019.01); *G06F 30/27* (2020.01); *G06N 3/08* (2013.01); *G06F 40/10* (2020.01); *G06F 40/216* (2020.01); *G10L 15/18* (2013.01); *G10L 15/183* (2013.01)

(56) References Cited

U.S. PATENT DOCUMENTS

| 2024/0117863 A1 | 4/2024 | Ahn et al. |
|---|---|---|
| 2024/0256757 A1 | 8/2024 | Manavoglu et al. |
| 2024/0320476 A1 | 9/2024 | Chandrasekaran |
| 2024/0354503 A1 | 10/2024 | Baruch et al. |
| 2024/0362093 A1* | 10/2024 | Zhou ..................... G06F 16/243 |
| 2024/0411824 A1 | 12/2024 | Sahu et al. |
| 2024/0428783 A1 | 12/2024 | Gupta et al. |
| 2025/0013833 A1* | 1/2025 | Mcnamara ........... G06F 40/226 |
| 2025/0080396 A1 | 3/2025 | Titon et al. |
| 2025/0111151 A1 | 4/2025 | Huang et al. |
| 2025/0156463 A1 | 5/2025 | Rosa et al. |

OTHER PUBLICATIONS

Kuhn, Lorenz et al., CLAM: Selective Clarification for Ambiguous Questions with Generative Language Models, arXiv.org, Feb. 20, 2023 (Feb. 20, 2023), Retrieved from the Internet: URL: https://arxiv.org/pdf/2212.07769 [retrieved on Feb. 26, 2025].

* cited by examiner

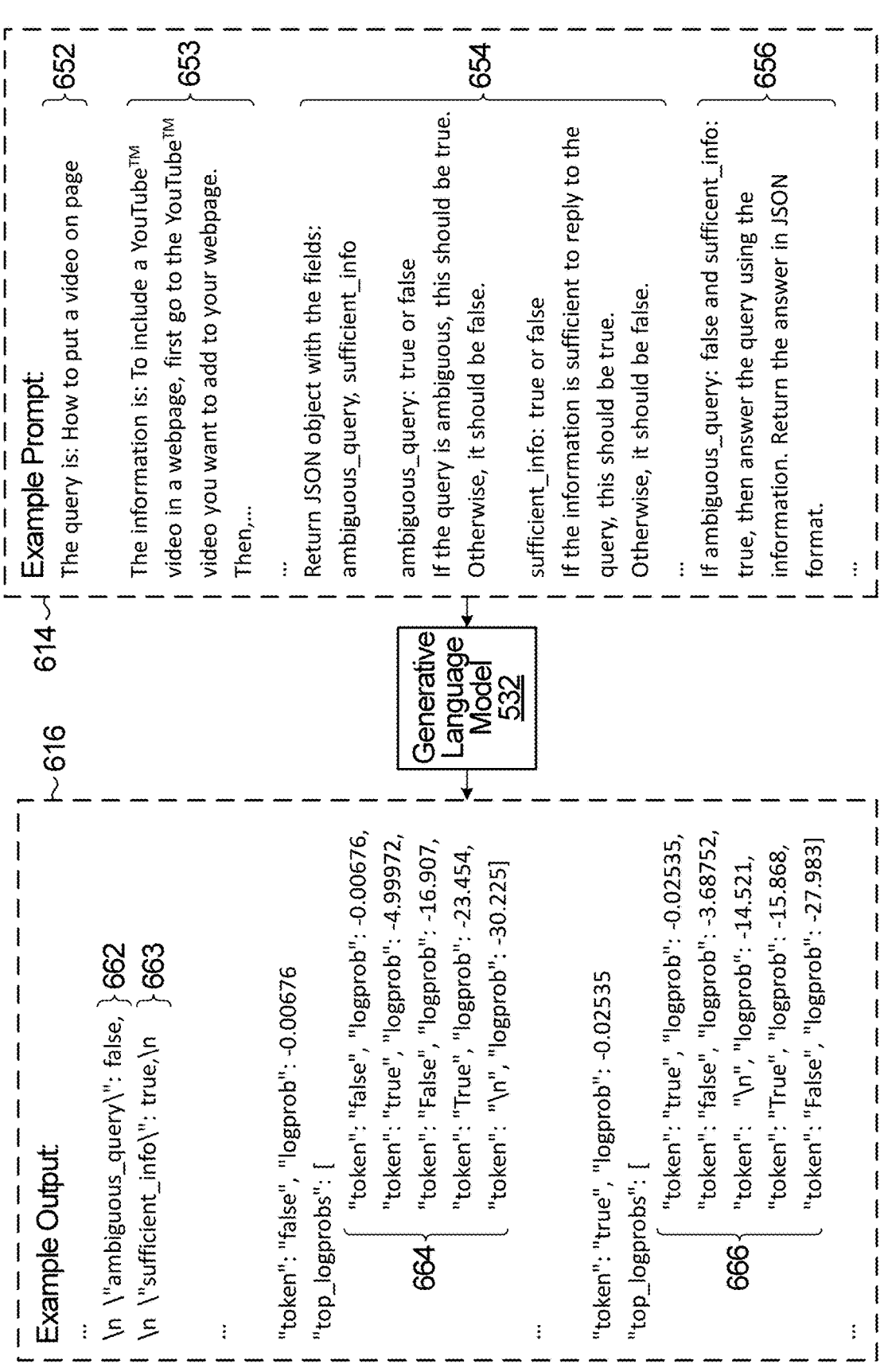

Example Prompt:

The query is: How to put a video on page } 652

The information is: To include a YouTube™ video in a webpage, first go to the YouTube™ video you want to add to your webpage.
Then,... } 653

...

Return JSON object with the fields: ambiguous_query, sufficient_info ambiguous_query: true or false
If the query is ambiguous, this should be true. Otherwise, it should be false.

sufficient_info: true or false
If the information is sufficient to reply to the query, this should be true. Otherwise, it should be false.

... } 654

...

If ambiguous_query: false and sufficient_info: true, then answer the query using the information. Return the answer in JSON format.

... } 656

614

Generative Language Model 532

616

Example Output:

...

\n \"ambiguous_query\": false, } 662
\n \"sufficient_info\": true,\n } 663

...

"token": "false", "logprob": -0.00676
"top_logprobs": [

"token": "false", "logprob": -0.00676,
"token": "true", "logprob": -4.99972,
"token": "False", "logprob": -16.907,
"token": "True", "logprob": -23.454,
"token": "\n", "logprob": -30.225]

} 664

...

"token": "true", "logprob": -0.02535
"top_logprobs": [

"token": "true", "logprob": -0.02535,
"token": "false", "logprob": -3.68752,
"token": "\n", "logprob": -14.521,
"token": "True", "logprob": -15.868,
"token": "False", "logprob": -27.983]

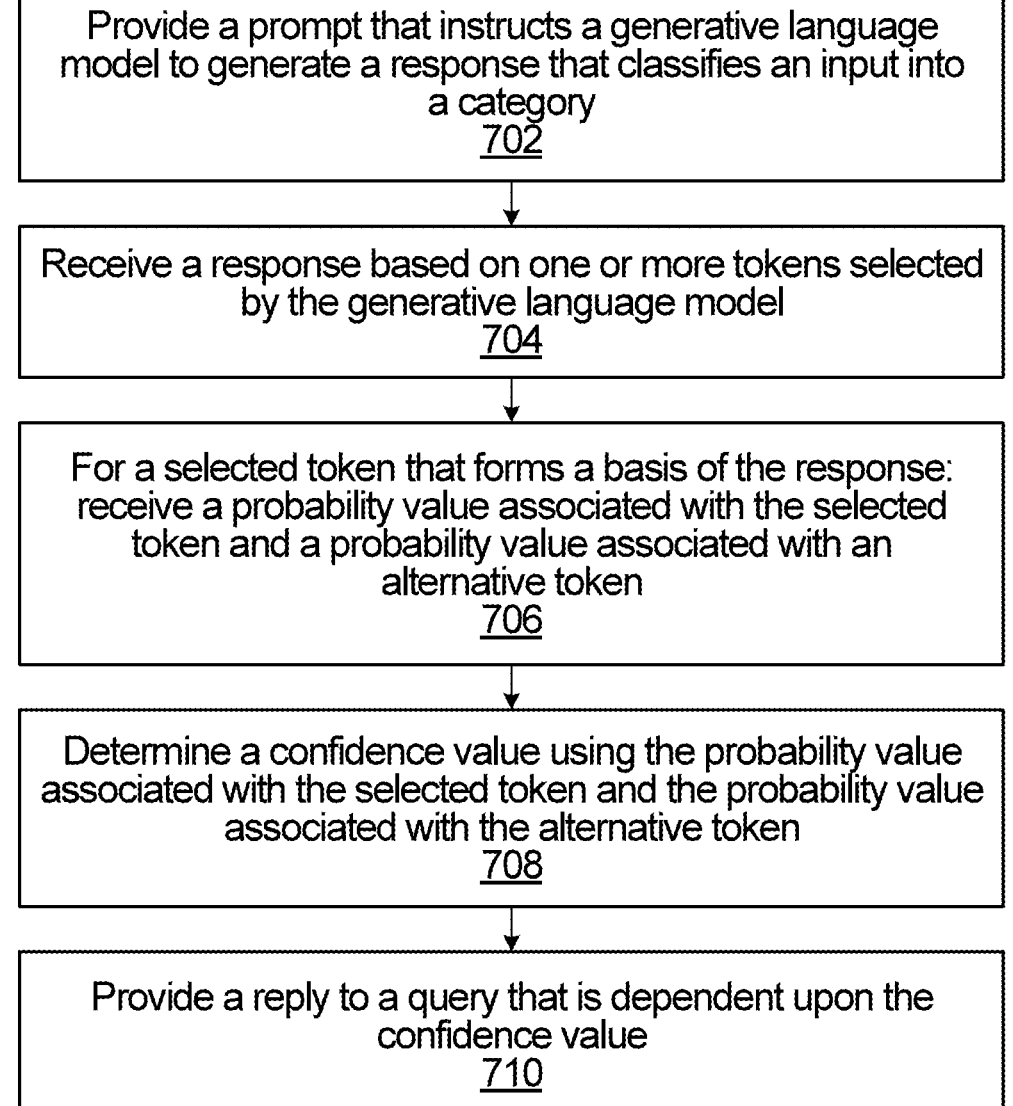

Provide a prompt that instructs a generative language model to generate a response that classifies an input into a category
702

Receive a response based on one or more tokens selected by the generative language model
704

For a selected token that forms a basis of the response: receive a probability value associated with the selected token and a probability value associated with an alternative token
706

Determine a confidence value using the probability value associated with the selected token and the probability value associated with the alternative token
708

Provide a reply to a query that is dependent upon the confidence value
710

FIG. 7

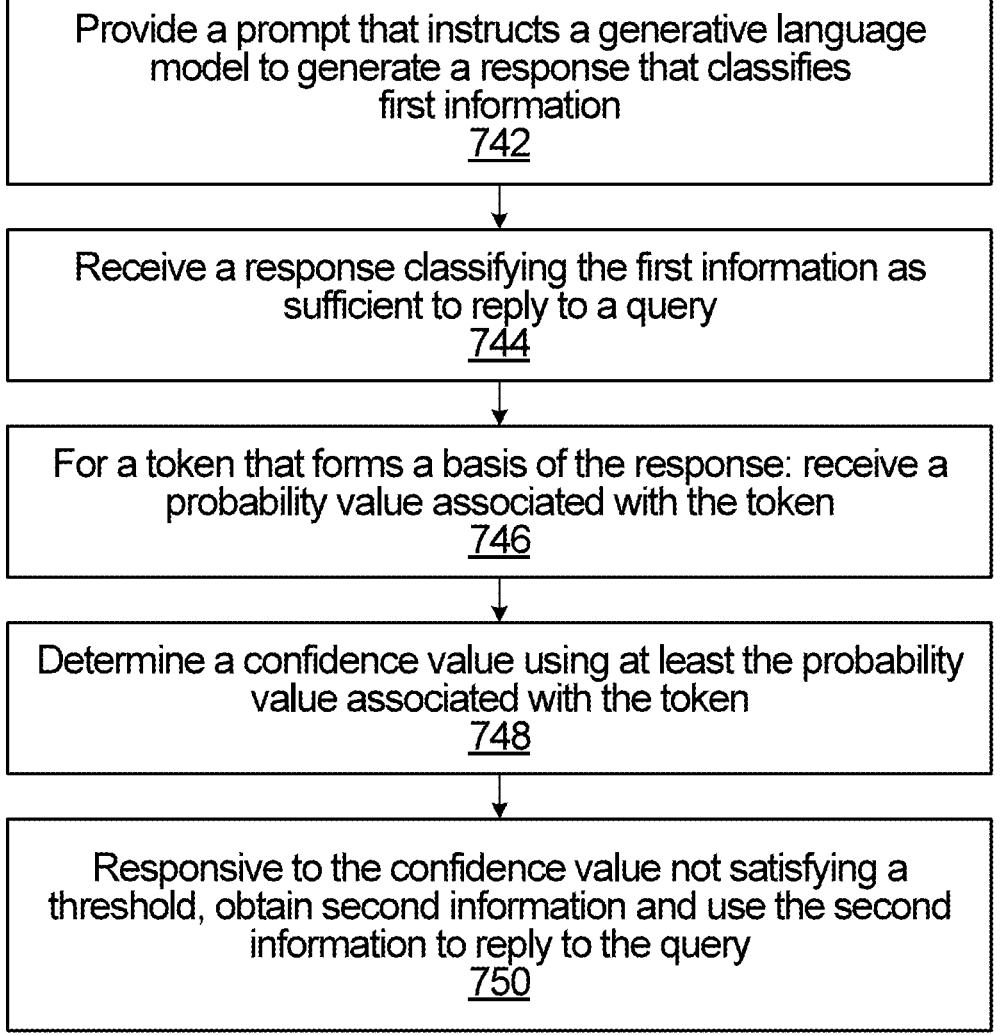

Provide a prompt that instructs a generative language
model to generate a response that classifies
first information
742

Receive a response classifying the first information as
sufficient to reply to a query
744

For a token that forms a basis of the response: receive a
probability value associated with the token
746

Determine a confidence value using at least the probability
value associated with the token
748

Responsive to the confidence value not satisfying a
threshold, obtain second information and use the second
information to reply to the query
750

FIG. 8

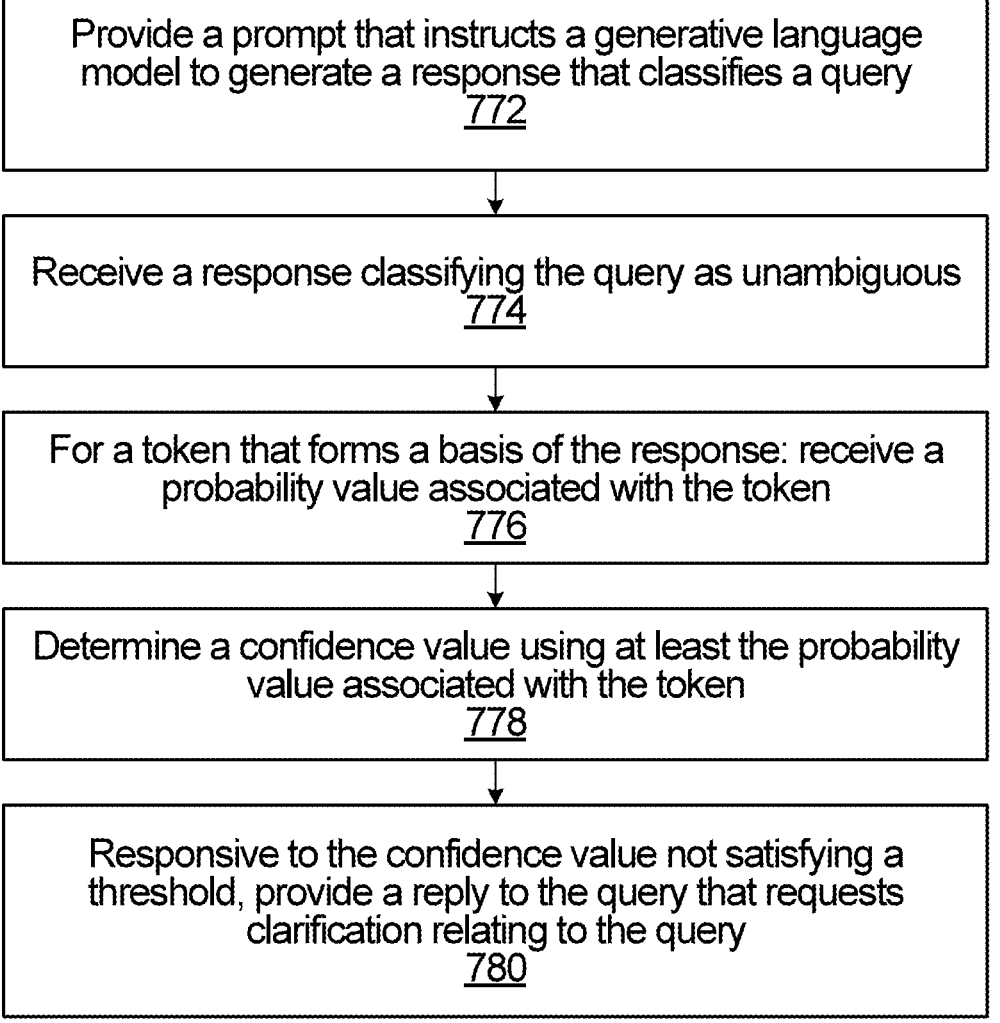

Provide a prompt that instructs a generative language model to generate a response that classifies a query
772

Receive a response classifying the query as unambiguous
774

For a token that forms a basis of the response: receive a probability value associated with the token
776

Determine a confidence value using at least the probability value associated with the token
778

Responsive to the confidence value not satisfying a threshold, provide a reply to the query that requests clarification relating to the query
780

FIG. 9

QUERY CLARIFICATION BASED ON CONFIDENCE IN A CLASSIFICATION PERFORMED BY A GENERATIVE LANGUAGE MACHINE LEARNING MODEL

CROSS-REFERENCE TO RELATED APPLICATIONS

The present application claims the benefit under 35 U.S.C § 119(e) of U.S. Provisional Patent Application Ser. No. 63/650,608, which was filed on May 22, 2024, and which is incorporated herein by reference.

FIELD

The present application relates to generative language machine learning models, such as large language models (LLMs).

BACKGROUND

A generative language model is a machine learning model that generates language, typically in the form of text in response to an input prompt. A generative language model may utilize a large neural network to determine probabilities for a next token of a sequence of text conditional on previous or historical tokens in the sequence of text. A large language model (LLM) is an example of a generative language model. Whenever "LLM" is used herein, it is an example and may be generalized to "generative language model".

SUMMARY

A generative language model, e.g. an LLM, may be used to classify an input into one of a plurality of categories. For example, the prompt provided to an LLM may include a query that asks a question, and the prompt may instruct the LLM to generate output including a response classifying the question as either clear or unclear. As another example, the prompt may include a user comment that is to be posted on a webpage, and the prompt may instruct the LLM to generate output including a response classifying the user comment as one of irrelevant, offensive, or appropriate.

The following technical problem exists when using an LLM to perform classification. The LLM is a generative model executed by a computational device that utilizes machine learning to generate a sequence of tokens. Each token in the sequence is selected and output by the LLM based on its probability of being a next token in the sequence, given the preceding tokens. One or more of the tokens form the basis of the response that classifies the input. For example, the LLM may generate a first token corresponding to "is", a next token corresponding to "the", a next token corresponding to "question", a next token corresponding to "cl", a next token corresponding to "ear", a next token corresponding to ":", and a next token corresponding to "yes", to provide output mapping to the statement "is the question clear: yes", which classifies the question as being clear.

Given the machine-learning operation of the LLM, the output of the LLM does not represent a definitive statement, but is based on probability computations of the machine learning model. Therefore, in the example above, although the output of the LLM may be mapped to "is the question clear: yes", the LLM could have instead generated "is the question clear: no", which is the opposite category. The selection of the token "yes" rather than "no" may be based on the LLM determining that the token "yes" is the most probable next token given the preceding tokens. However, most probable does not necessarily mean correct. Classification into the wrong category by the LLM results in downstream technical problems. In particular, the LLM will typically generate additional output based on the classification. For example, if the LLM classifies the question as clear, the LLM may output additional tokens that form the basis of an answer to the question. However, if the question was actually unclear, the answer will likely be hallucination or irrelevant, which can result in additional prompts to the LLM to try to obtain a relevant answer. This has a material impact on the computer system, not just because of the additional computation power/operations, but because an LLM is a precious computing resource often having a token limit and/or a limit on how many prompts can be sent to LLM. The waste of tokens and/or wasted prompts may lead to slow performance, e.g. due to a delay resulting from a token limit being exceeded.

In addition, there is also an impact on machine-user interaction. Continuing the example above, if the user submits a question to the LLM, and the question is classified by the LLM as clear, but the question is actually unclear, the reply from the LLM will likely provide information that the user considers to be hallucination or irrelevant, requiring the user to have to retry. In another example, if the LLM classifies content as appropriate, whereas the content is actually offensive, the offensive content may be posted on a webpage, which is failed content moderation.

In some aspects, to try to mitigate at least one of the technical drawbacks discussed above, when an LLM generates a response that classifies an input, one or more probability values associated with a token that forms the basis of the response may be used to determine a confidence value. A "probability value", as used herein, may be a probability between zero and one, or an equivalent log probability, or more generally any value that is based on or indicative of a probability. The confidence value is indicative of confidence in the classification performed by the LLM. An action may be taken based on the confidence value, e.g. the action might include stopping generation of output from the LLM, and/or modifying the output from the LLM, and/or providing a new input prompt to the LLM, and/or providing a reply based on the confidence value, etc., depending upon the implementation.

In one example, a prompt instructs an LLM to generate a response that classifies an input into one category of a plurality of categories. The response received from the LLM is based on one or more tokens selected and output by the LLM. For a selected token that forms a basis of the response, the LLM returns a probability value associated with that token and a probability value associated with an alternative token that was not selected by the LLM. A confidence value is determined using the probability value associated with the selected token and the probability value associated with the alternative token, e.g. by comparing the two probability values. An action may then be taken based on the confidence value, e.g. a reply to a query may be provided that is dependent upon the confidence value.

In another example, an LLM prompt includes information, and the LLM generates a response that classifies the information as being sufficient to reply to a query. For a token that forms a basis of the response, the LLM returns a probability value associated with that token. A confidence value is determined using the probability value associated with the token. If the confidence value does not satisfy a threshold, then an action may be taken, e.g. other information may be obtained and used to reply to the query.

In another example, an LLM prompt includes a query, and the LLM generates a response that classifies the query as being unambiguous. For a token that forms a basis of the response, the LLM returns a probability value associated with that token. A confidence value is determined using the probability value associated with the token. If the confidence value does not satisfy a threshold, then an action may be taken, e.g. a reply to the query may be provided that requests clarification relating to the query.

In one aspect, there is provided a computer-implemented method. The method may include providing a prompt to a generative language model. The prompt may instruct the generative language model to generate a response that classifies an input of the prompt into one category of a plurality of categories. The method may further include receiving the response from the generative language model. The response is based on one or more tokens selected by the generative language model. For a selected token that forms a basis of the response, the method may include receiving, from the generative language model, a probability value associated with the selected token and a probability value associated with an alternative token that was not selected by the generative language model to form the basis of the response. The method may further include determining a confidence value using the probability value associated with the selected token and the probability value associated with the alternative token. The method may further include providing a reply to a query that is dependent upon the confidence value.

In some implementations, the alternative token that was not selected may correspond to another category of the plurality of categories. In some implementations, the alternative token that was not selected may have a next highest associated probability after the selected token.

In some implementations, there might only be two categories, and the response may classify the input into one of the two categories. In some such implementations, the response may have one of two response values, where the two response values are a first response value that corresponds to the selected token and a second response value that corresponds to the alternative token.

In some implementations, determining the confidence value may include performing a comparison between the probability value associated with the selected token and the probability value associated with the alternative token. In some such implementations, the confidence value may be based on the comparison.

In some implementations, the category into which the input is classified may be a first category, and the alternative token may correspond to a different second category. In some implementations, for the selected token that forms the basis of the response, the method may include receiving, from the generative language model: (i) an indication of two or more alternative tokens, including the alternative token, that were not selected to form the basis of the response, and (ii) for each of the alternative tokens a respective probability value. In some implementations, the method may further include categorizing each of one or more of the alternative tokens into a respective category of the plurality of categories. In some implementations, the method may include determining a first category probability value that is either: (i) obtained by combining the probability value associated with the selected token with at least one other probability value associated with at least one alternative token categorized into the first category, or (ii) equal to the probability value associated with the selected token responsive to none of the alternative tokens being categorized into the first category. In some implementations, the method may further include determining a second category probability value that is either: (i) obtained by combining the probability value associated with the alternative token with at least one other probability value associated with at least one other alternative token categorized into the second category, or (ii) equal to the probability value associated with the alternative token responsive to none of the other alternative tokens being categorized into the second category. In some implementations, the method may further include performing a comparison between the first category probability value and the second category probability value, and the confidence value may be based on the comparison.

In some implementations, providing the reply may include providing the response along with information generated based on the confidence value.

In some implementations, the prompt is a first prompt, and providing the reply may include: responsive to the confidence value not satisfying a threshold, providing a second prompt to the generative language model, and providing a reply based on output from the generative language model responsive to the second prompt. In some such implementations, the second prompt may indicate, to the generative language model, that the input is classified into another category different from the category into which the input was classified by the response.

In some implementations, the method may further include: responsive to the confidence value not satisfying a threshold, modifying the response to classify the input into another category different from the category into which the input was originally classified by the response. In some implementations, the method may further include continuing generation of output from the generative language model with the response modified. In some implementations, the method may further include providing the reply based on the output from the generative language model with the response modified.

In some implementations, the input of the prompt may be or include the query. In some implementations, the prompt may instruct the generative language model to classify the query into one of two categories, where a first category of the two categories corresponds to the query being unambiguous, and a second category of the two categories corresponds to the query being ambiguous. In some implementations, the response may classify the query into the first category corresponding to the query being unambiguous. In some implementations, the selected token forms the basis of the response classifying the query as unambiguous, and the alternative token corresponds to the query being classified as ambiguous.

In some implementations, the input of the prompt may be or include the query and information. In some implementations, the prompt may instruct the generative language model to classify the information into one of two categories, where a first category of the two categories corresponds to the information being sufficient to reply to the query, and a second category of the two categories corresponds to the information being insufficient to reply to the query. In some implementations, the response may classify the information into the first category corresponding to the information being sufficient to reply to the query. In some implementations, the selected token forms the basis of the response classifying the information as sufficient to reply to the query, and the alternative token corresponds to the information being insufficient to reply to the query.

In another aspect, there is provided another computer-implemented method. The method may include providing a prompt to a generative language model. The prompt may include first information. The prompt may instruct the generative language model to generate a response that classifies the first information into one of a plurality of categories. The plurality of categories may include a category corresponding to the first information being sufficient to reply to a query. The method may further include receiving the response from the generative language model, the response classifying the first information into the category corresponding to the first information being sufficient to reply to the query. The response may be based on one or more tokens selected by the generative language model. For a token that forms a basis of the response, the method may further include receiving, from the generative language model, a probability value associated with the token. The method may further include determining a confidence value using at least the probability value associated with the token. Responsive to the confidence value not satisfying a threshold, the method may further include obtaining second information and using the second information to reply to the query.

In some implementations, the prompt is a first prompt, and using the second information to reply to the query may include: including the second information in a second prompt to the generative language model, and replying to the query based on output of the generative language model responsive to the second prompt.

In some implementations, the response is a first response, the token is a first token, the probability value is a first probability value, the confidence value is a first confidence value, and the method may further include: instructing, in the second prompt, the generative language model to generate a second response that classifies the second information; receiving a second response from the generative language model, the second response classifying the second information into the category corresponding to the second information being sufficient; for a second token that forms a basis of the second response: receiving, from the generative language model, a second probability value associated with the second token; and determining a second confidence value using at least the second probability value associated with the second token. Using the second information to reply to the query may be responsive to the second confidence value satisfying the threshold.

In some implementations, the first information may be based on search results from searching a collection of data. In some implementations, the second information may be based on different search results from searching the collection of data or from searching a different collection of data. In some implementations, the method may further include converting the query into an embedding vector, and searching may be performed by using the embedding vector to search a collection of vectors representing embedded information.

In some implementations, the method may further include instructing the generative language model to generate content summarizing the first information or capturing parts of the first information that are relevant to the query, and in response receiving the content output from the generative language model. In some implementations, the content may be included as part of the second information.

In some implementations, responsive to the confidence value not satisfying the threshold, the method may include iteratively performing the following steps for each iteration: obtaining new information and providing the new information to the generative language model; receiving a corresponding reply from the generative language model that classifies the new information as being sufficient; for a token that forms the basis of the corresponding reply: receiving, from the generative language model, a respective probability value associated with the token; determining a corresponding confidence value using the respective probability value; and responsive to the corresponding confidence value still not satisfying the threshold, performing a next iteration. In some implementations, in a final iteration the corresponding confidence value satisfies the threshold, and the new information obtained in the final iteration is the second information that is used to reply to the query.

In some implementations, the token that forms the basis of the response is a selected token, and the method further includes receiving, from the generative language model, a probability value associated with an alternative token that was not selected by the generative language model to form the basis of the response. In some such implementations, the confidence value may be determined using the probability value associated with the selected token and the probability value associated with the alternative token. In some implementations, the alternative token that was not selected may correspond to another category of the plurality of categories. In some implementations, the alternative token that was not selected may have a next highest associated probability after the selected token.

In some implementations, there are only two categories, the two categories being a first category corresponding to the first information being sufficient to reply to the query and a second category corresponding to the first information being insufficient to reply to the query. In some implementations, the response can be one of two response values, wherein a first response value of the two response values corresponds to the first information being sufficient to reply to the query and the second response value of the two response values corresponds to the first information being insufficient to reply to the query. In some implementations, the response is the first response value corresponding to the first information being sufficient to reply to the query, the selected token corresponds to the first response value, and the alternative token corresponds to the second response value.

In some implementations, determining the confidence value may include performing a comparison between the probability value associated with the selected token and the probability value associated with the alternative token. In some implementations, the confidence value may be based on the comparison.

In another aspect, there is provided another computer-implemented method. The method may include providing a prompt to a generative language model. The prompt may include a query. The prompt may instruct the generative language model to generate a response that classifies the query into one of a plurality of categories. The plurality of categories may include a category corresponding to the query being unambiguous. The method may further include receiving the response from the generative language model. The response may classify the query into the category corresponding to the query being unambiguous. The response may be based on one or more tokens selected by the generative language model. For a token that forms a basis of the response, the method may further include receiving, from the generative language model, a probability value associated with the token. The method may further include determining a confidence value using at least the probability value associated with the token. Responsive to the confidence value not satisfying a threshold, the method may further include providing a reply to the query that requests clarification relating to the query.

In some implementations, the reply to the query may be based on output from the generative language model.

In some implementations, the prompt is a first prompt, and providing the reply may include: providing a second prompt to the generative language model, and providing the reply to the query based on output from the generative language model responsive to the second prompt. In some implementations, the second prompt may indicate, to the generative language model, that the query is classified into another category different from the category into which the query was classified by the response. In some implementations, the second prompt may include information retrieved based on the query. In some implementations, the second prompt may instruct the generative language model to use the information to generate the reply that requests clarification.

In some implementations, the method may further include: responsive to the confidence value not satisfying the threshold, modifying the response to classify the query into another category different from the category into which the query was originally classified by the response. In some implementations, the method may further include continuing generation of output from the generative language model with the response modified. In some implementations, the method may further include providing the reply based on the output from the generative language model with the response modified.

In some implementations, the token that forms the basis of the response is a selected token, and the method may further include receiving, from the generative language model, a probability value associated with an alternative token that was not selected by the generative language model to form the basis of the response. In some implementations, the confidence value may be determined using the probability value associated with the selected token and the probability value associated with the alternative token. In some implementations, the alternative token that was not selected may correspond to another category of the plurality of categories. In some implementations, the alternative token that was not selected may have a next highest associated probability after the selected token.

In some implementations, there are only two categories, the two categories being a first category corresponding to the query being unambiguous and a second category corresponding to the query being ambiguous. In some implementations, the response may be one of two response values, where a first response value of the two response values corresponds to the query being unambiguous and the second response value of the two response values corresponds to the query being ambiguous. In some implementations, the response may be the first response value corresponding to the query being unambiguous. In some implementations, the selected token may correspond to the first response value, and the alternative token may correspond to the second response value.

In some implementations, determining the confidence value may include performing a comparison between the probability value associated with the selected token and the probability value associated with the alternative token. In some implementations, the confidence value may be based on the comparison.

In another aspect, a system is provided that is configured to perform any of the methods disclosed herein. For example, the system may include at least one processor to directly perform (or control/instruct the system to perform)

the method steps. In some implementations, the system includes at least one processor and a memory storing processor-executable instructions that, when executed by the at least one processor, cause the system to perform any of the methods described herein.

In another aspect, there is provided a computer-readable storage medium having stored thereon computer-executable instructions that, when executed by at least one processor, cause the at least one processor to perform any of the methods disclosed herein. The computer-readable storage medium may be non-transitory.

BRIEF DESCRIPTION OF THE DRAWINGS

Embodiments will be described, by way of example only, with reference to the accompanying figures wherein:

FIG. 5 illustrates an example prompt and example output responsive to the prompt from a generative language model;

FIGS. 7 to 9 each illustrate example computer-implemented methods.

DETAILED DESCRIPTION

Figure 1A:
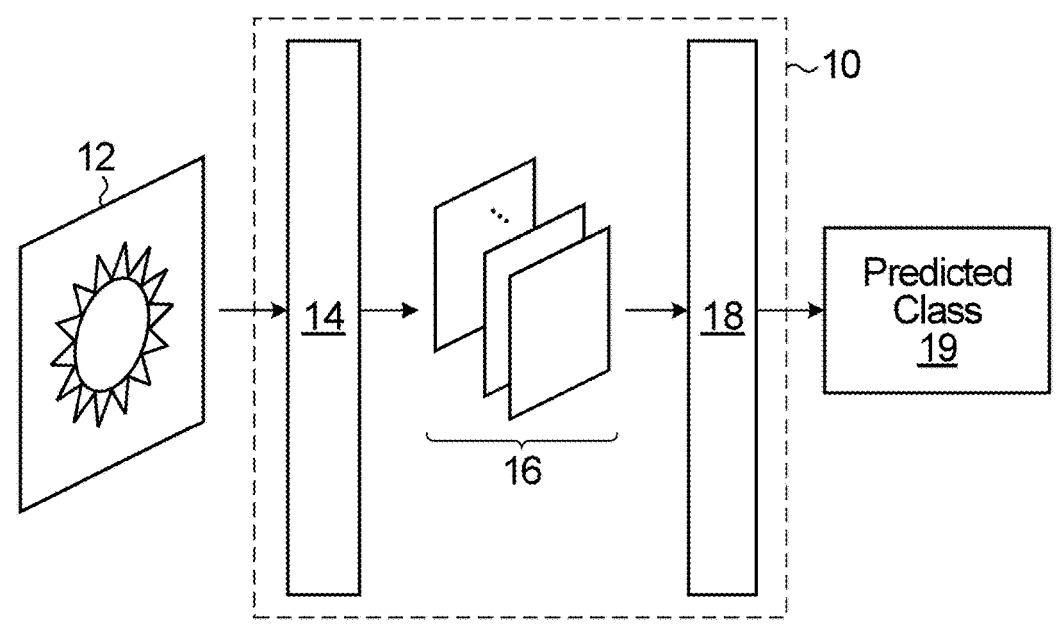
FIG. 1A is a simplified block diagram of a simplified convolutional neural network.

For illustrative purposes, specific embodiments will now be explained in greater detail below in conjunction with the figures.

To assist in understanding the present disclosure, some concepts relevant to neural networks and machine learning (ML) are first discussed.

Generally, a neural network comprises a number of computation units (sometimes referred to as "neurons"). Each neuron receives an input value and applies a function to the input to generate an output value. The function typically includes a parameter (also referred to as a "weight") whose value is learned through the process of training. A plurality of neurons may be organized into a neural network layer (or simply "layer") and there may be multiple such layers in a neural network. The output of one layer may be provided as input to a subsequent layer. Thus, input to a neural network may be processed through a succession of layers until an output of the neural network is generated by a final layer. This is a simplistic discussion of neural networks and there may be more complex neural network designs that include feedback connections, skip connections, and/or other such possible connections between neurons and/or layers, which need not be discussed in detail here.

A deep neural network (DNN) is a type of neural network having multiple layers and/or a large number of neurons. The term DNN may encompass any neural network having multiple layers, including convolutional neural networks (CNNs), recurrent neural networks (RNNs), and multilayer perceptrons (MLPs), among others.

DNNs are often used as ML-based models for modeling complex behaviors (e.g., human language, image recognition, object classification, etc.) in order to improve accuracy of outputs (e.g., more accurate predictions) such as, for example, as compared with models with fewer layers. In the present disclosure, the term "ML-based model" or more simply "ML model" may be understood to refer to a DNN. Training a ML model refers to a process of learning the values of the parameters (or weights) of the neurons in the layers such that the ML model is able to model the target behavior to a desired degree of accuracy. Training typically requires the use of a training dataset, which is a set of data that is relevant to the target behavior of the ML model. For example, to train a ML model that is intended to model human language (also referred to as a language model), the training dataset may be a collection of text documents, referred to as a text corpus (or simply referred to as a corpus). The corpus may represent a language domain (e.g., a single language), a subject domain (e.g., scientific papers), and/or may encompass another domain or domains, be they larger or smaller than a single language or subject domain. For example, a relatively large, multilingual and non-subject-specific corpus may be created by extracting text from online webpages and/or publicly available social media posts. In another example, to train a ML model that is intended to classify images, the training dataset may be a collection of images. Training data may be annotated with ground truth labels (e.g. each data entry in the training dataset may be paired with a label), or may be unlabeled.

Training a ML model generally involves inputting into an ML model (e.g. an untrained ML model) training data to be processed by the ML model, processing the training data using the ML model, collecting the output generated by the ML model (e.g. based on the inputted training data), and comparing the output to a desired set of target values. If the training data is labeled, the desired target values may be, e.g., the ground truth labels of the training data. If the training data is unlabeled, the desired target value may be a reconstructed (or otherwise processed) version of the corresponding ML model input (e.g., in the case of an autoencoder), or may be a measure of some target observable effect on the environment (e.g., in the case of a reinforcement learning agent). The parameters of the ML model are updated based on a difference between the generated output value and the desired target value. For example, if the value outputted by the ML model is excessively high, the parameters may be adjusted so as to lower the output value in future training iterations. An objective function is a way to quantitatively represent how close the output value is to the target value. An objective function represents a quantity (or one or more quantities) to be optimized (e.g., minimize a loss or maximize a reward) in order to bring the output value as close to the target value as possible. The goal of training the ML model typically is to minimize a loss function or maximize a reward function.

The training data may be a subset of a larger data set. For example, a data set may be split into three mutually exclusive subsets: a training set, a validation (or cross-validation) set, and a testing set. The three subsets of data may be used sequentially during ML model training. For example, the training set may be first used to train one or more ML models, each ML model, e.g., having a particular architecture, having a particular training procedure, being describable by a set of model hyperparameters, and/or otherwise being varied from the other of the one or more ML models. The validation (or cross-validation) set may then be used as input data into the trained ML models to, e.g., measure the performance of the trained ML models and/or compare performance between them. Where hyperparameters are used, a new set of hyperparameters may be determined based on the measured performance of one or more of the trained ML models, and the first step of training (i.e., with the training set) may begin again on a different ML model described by the new set of determined hyperparameters. In this way, these steps may be repeated to produce a more performant trained ML model. Once such a trained ML model is obtained (e.g., after the hyperparameters have been adjusted to achieve a desired level of performance), a third step of collecting the output generated by the trained ML model applied to the third subset (the testing set) may begin. The output generated from the testing set may be compared with the corresponding desired target values to give a final assessment of the trained ML model's accuracy. Other segmentations of the larger data set and/or schemes for using the segments for training one or more ML models are possible.

Backpropagation is an algorithm for training a ML model. Backpropagation is used to adjust (also referred to as update) the value of the parameters in the ML model, with the goal of optimizing the objective function. For example, a defined loss function is calculated by forward propagation of an input to obtain an output of the ML model and comparison of the output value with the target value. Backpropagation calculates a gradient of the loss function with respect to the parameters of the ML model, and a gradient algorithm (e.g., gradient descent) is used to update (i.e., "learn") the parameters to reduce the loss function. Backpropagation is performed iteratively, so that the loss function is converged or minimized. Other techniques for learning the parameters of the ML model may be used. The process of updating (or learning) the parameters over many iterations is referred to as training. Training may be carried out iteratively until a convergence condition is met (e.g., a predefined maximum number of iterations has been performed, or the value outputted by the ML model is sufficiently converged with the desired target value), after which the ML model is considered to be sufficiently trained. The values of the learned parameters may then be fixed and the ML model may be deployed to generate output in real-world applications (also referred to as "inference").

In some examples, a trained ML model may be fine-tuned, meaning that the values of the learned parameters may be adjusted slightly in order for the ML model to better model a specific task. Fine-tuning of a ML model typically involves further training the ML model on a number of data samples (which may be smaller in number/cardinality than those used to train the model initially) that closely target the specific task. For example, a ML model for generating natural language that has been trained generically on publically-available text corpuses may be, e.g., fine-tuned by further training using the complete works of Shakespeare as training data samples (e.g., where the intended use of the ML model is generating a scene of a play or other textual content in the style of Shakespeare).

FIG. 1A is a simplified diagram of an example CNN 10, which is an example of a DNN that is commonly used for image processing tasks such as image classification, image analysis, object segmentation, etc. An input to the CNN 10 may be a 2D RGB image 12.

The CNN 10 includes a plurality of layers that process the image 12 in order to generate an output, such as a predicted classification or predicted label for the image 12. For simplicity, only a few layers of the CNN 10 are illustrated including at least one convolutional layer 14. The convolutional layer 14 performs convolution processing, which may involve computing a dot product between the input to the convolutional layer 14 and a convolution kernel. A convolutional kernel is typically a 2D matrix of learned parameters that is applied to the input in order to extract image features. Different convolutional kernels may be applied to extract different image information, such as shape information, color information, etc.

The output of the convolution layer 14 is a set of feature maps 16 (sometimes referred to as activation maps). Each feature map 16 generally has smaller width and height than the image 12. The set of feature maps 16 encode image features that may be processed by subsequent layers of the CNN 10, depending on the design and intended task for the CNN 10. In this example, a fully connected layer 18 processes the set of feature maps 16 in order to perform a classification of the image, based on the features encoded in the set of feature maps 16. The fully connected layer 18 contains learned parameters that, when applied to the set of feature maps 16, outputs a set of probabilities representing the likelihood that the image 12 belongs to each of a defined set of possible classes. The class having the highest probability may then be outputted as the predicted classification for the image 12.

In general, a CNN may have different numbers and different types of layers, such as multiple convolution layers, max-pooling layers and/or a fully connected layer, among others. The parameters of the CNN may be learned through training, using data having ground truth labels specific to the desired task (e.g., class labels if the CNN is being trained for a classification task, pixel masks if the CNN is being trained for a segmentation task, text annotations if the CNN is being trained for a captioning task, etc.), as discussed above.

Some concepts in ML-based language models are now discussed. It may be noted that, while the term "language model" has been commonly used to refer to a ML-based language model, there could exist non-ML language models. In the present disclosure, the term "language model" may be used as shorthand for ML-based language model (i.e., a language model that is implemented using a neural network or other ML architecture), unless stated otherwise. For example, unless stated otherwise, "language model" encompasses LLMs.

A language model may use a neural network (typically a DNN) to perform natural language processing (NLP) tasks such as language translation, image captioning, grammatical error correction, and language generation, among others. A language model may be trained to model how words relate to each other in a textual sequence, based on probabilities. A language model may contain hundreds of thousands of learned parameters or in the case of a large language model (LLM) may contain millions or billions of learned parameters or more.

In recent years, there has been interest in a type of neural network architecture, referred to as a transformer, for use as language models. For example, the Bidirectional Encoder Representations from Transformers (BERT) model, the Transformer-XL model and the Generative Pre-trained Transformer (GPT) models are types of transformers. A transformer is a type of neural network architecture that uses self-attention mechanisms in order to generate predicted output based on input data that has some sequential meaning (i.e., the order of the input data is meaningful, which is the case for most text input). Although transformer-based language models are described herein, it should be understood that the present disclosure may be applicable to any ML-based language model, including language models based on other neural network architectures such as recurrent neural network (RNN)-based language models.

Figure 1B:
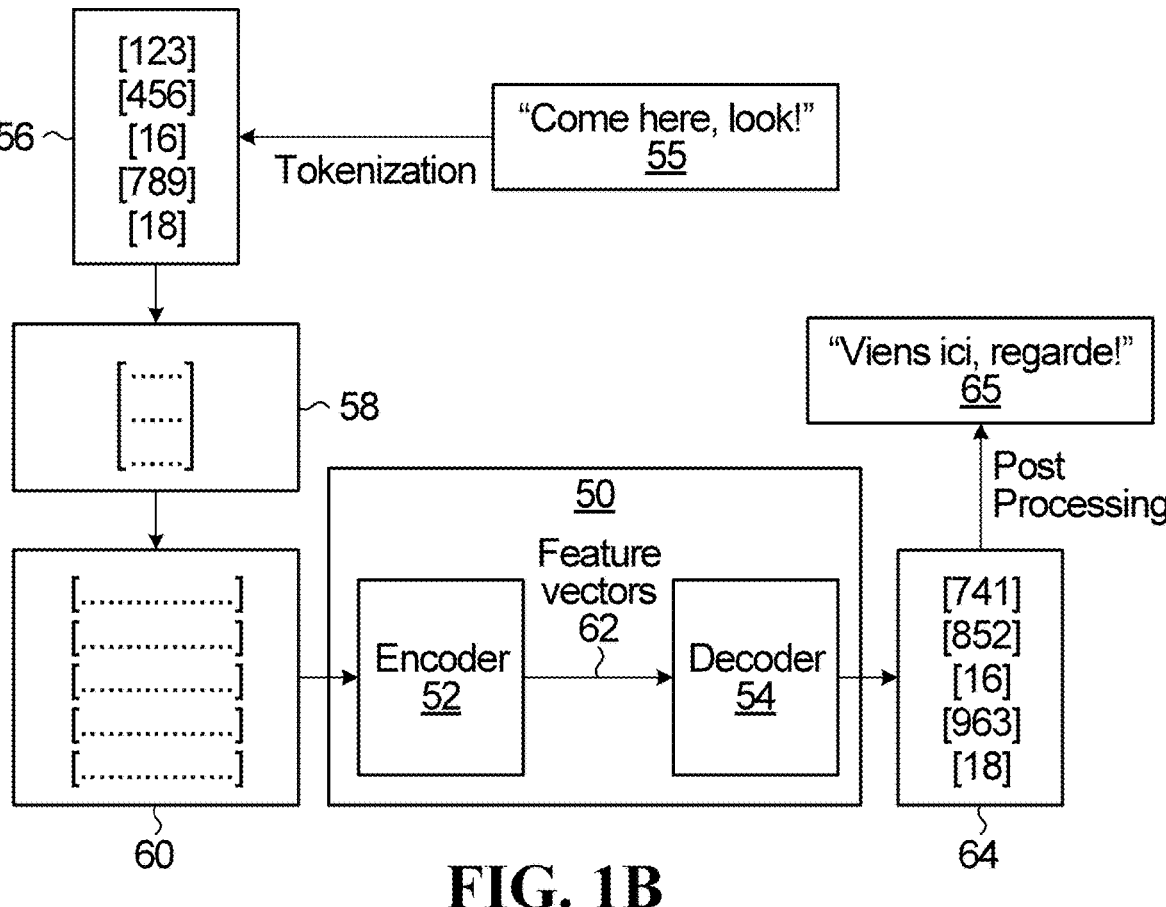
FIG. 1B is a simplified block diagram of an example transformer neural network.

FIG. 1B is a simplified diagram of an example transformer 50, and a simplified discussion of its operation is now provided. The transformer 50 includes an encoder 52 (which may comprise one or more encoder layers/blocks connected in series) and a decoder 54 (which may comprise one or more decoder layers/blocks connected in series). Generally, the encoder 52 and the decoder 54 each include a plurality of neural network layers, at least one of which may be a self-attention layer. The parameters of the neural network layers may be referred to as the parameters of the language model.

The transformer 50 may be trained on a text corpus that is labelled (e.g., annotated to indicate verbs, nouns, etc.) or unlabelled. LLMs may be trained on a large unlabelled corpus. Some LLMs may be trained on a large multi-language, multi-domain corpus, to enable the model to be versatile at a variety of language-based tasks such as generative tasks (e.g., generating human-like natural language responses to natural language input).

An example of how the transformer 50 may process textual input data is now described. Input to a language model (whether transformer-based or otherwise) typically is in the form of natural language as may be parsed into tokens. It should be appreciated that the term "token" in the context of language models and NLP has a different meaning from the use of the same term in other contexts such as data security. Tokenization, in the context of language models and NLP, refers to the process of parsing textual input (e.g., a character, a word, a phrase, a sentence, a paragraph, etc.) into a sequence of shorter segments that are converted to numerical representations referred to as tokens (or "compute tokens"). Typically, a token may be an integer that corresponds to the index of a text segment (e.g., a word) in a vocabulary dataset. Often, the vocabulary dataset is arranged by frequency of use. Commonly occurring text, such as punctuation, may have a lower vocabulary index in the dataset and thus be represented by a token having a smaller integer value than less commonly occurring text. Tokens frequently correspond to words, with or without whitespace appended. In some examples, a token may correspond to a portion of a word. For example, the word "lower" may be represented by a token for [low] and a second token for [er]. In another example, the text sequence "Come here, look!" may be parsed into the segments [Come], [here], [,], [look] and [!], each of which may be represented by a respective numerical token. In addition to tokens that are parsed from the textual sequence (e.g., tokens that correspond to words and punctuation), there may also be special tokens to encode non-textual information. For example, a [CLASS] token may be a special token that corresponds to a classification of the textual sequence (e.g., may classify the textual sequence as a poem, a list, a paragraph, etc.), a [EOT] token may be another special token that indicates the end of the textual sequence, other tokens may provide formatting information, etc.

In FIG. 1B, a short sequence of tokens 56 corresponding to the text sequence "Come here, look!" is illustrated as input to the transformer 50. Tokenization of the text sequence into the tokens 56 may be performed by some pre-processing tokenization module such as, for example, a byte pair encoding tokenizer (the "pre" referring to the tokenization occurring prior to the processing of the tokenized input by the LLM), which is not shown in FIG. 1B for simplicity. In general, the token sequence that is inputted to the transformer 50 may be of any length up to a maximum length defined based on the dimensions of the transformer 50 (e.g., such a limit may be 2048 tokens in some LLMs).

Each token 56 in the token sequence is converted into an embedding vector 60 (also referred to simply as an embedding). An embedding 60 is a learned numerical representation (such as, for example, a vector) of a token that captures some semantic meaning of the text segment represented by the token 56. The embedding 60 represents the text segment corresponding to the token 56 in a way such that embeddings corresponding to semantically-related text are closer to each other in a vector space than embeddings corresponding to semantically-unrelated text. For example, assuming that the words "look", "see", and "cake" each correspond to, respectively, a "look" token, a "see" token, and a "cake" token when tokenized, the embedding 60 corresponding to the "look" token will be closer to another embedding corresponding to the "see" token in the vector space, as compared to the distance between the embedding 60 corresponding to the "look" token and another embedding corresponding to the "cake" token. The vector space may be defined by the dimensions and values of the embedding vectors. Various techniques may be used to convert a token 56 to an embedding 60. For example, another trained ML model may be used to convert the token 56 into an embedding 60. In particular, another trained ML model may be used to convert the token 56 into an embedding 60 in a way that encodes additional information into the embedding 60 (e.g., a trained ML model may encode positional information about the position of the token 56 in the text sequence into the embedding 60). In some examples, the numerical value of the token 56 may be used to look up the corresponding embedding in an embedding matrix 58 (which may be learned during training of the transformer 50).

The generated embeddings 60 are input into the encoder 52. The encoder 52 serves to encode the embeddings 60 into feature vectors 62 that represent the latent features of the embeddings 60. The encoder 52 may encode positional information (i.e., information about the sequence of the input) in the feature vectors 62. The feature vectors 62 may have very high dimensionality (e.g., on the order of thousands or tens of thousands), with each element in a feature vector 62 corresponding to a respective feature. The numerical weight of each element in a feature vector 62 represents the importance of the corresponding feature. The space of all possible feature vectors 62 that can be generated by the encoder 52 may be referred to as the latent space or feature space.

Conceptually, the decoder 54 is designed to map the features represented by the feature vectors 62 into meaningful output, which may depend on the task that was assigned to the transformer 50. For example, if the transformer 50 is used for a translation task, the decoder 54 may map the feature vectors 62 into text output in a target language different from the language of the original tokens 56. Generally, in a generative language model, the decoder 54 serves to decode the feature vectors 62 into a sequence of tokens. The decoder 54 may generate output tokens 64 one by one. Each output token 64 may be fed back as input to the decoder 54 in order to generate the next output token 64. By feeding back the generated output and applying self-attention, the decoder 54 is able to generate a sequence of output tokens 64 that has sequential meaning (e.g., the resulting output text sequence is understandable as a sentence and obeys grammatical rules). The decoder 54 may generate output tokens 64 until a special [EOT] token (indicating the end of the text) is generated. The resulting sequence of output tokens 64 may then be converted to a text sequence in post-processing. For example, each output token 64 may be an integer number that corresponds to a vocabulary index.

By looking up the text segment using the vocabulary index, the text segment corresponding to each output token 64 can be retrieved, the text segments can be concatenated together and the final output text sequence (in this example, "Viens ici, regarde!") can be obtained.

Although a general transformer architecture for a language model and its theory of operation have been described above, this is not intended to be limiting. Existing language models include language models that are based only on the encoder of the transformer or only on the decoder of the transformer. An encoder-only language model encodes the input text sequence into feature vectors that can then be further processed by a task-specific layer (e.g., a classification layer). BERT is an example of a language model that may be considered to be an encoder-only language model. A decoder-only language model accepts embeddings as input and may use auto-regression to generate an output text sequence. Transformer-XL and GPT-type models may be language models that are considered to be decoder-only language models.

Because GPT-type language models tend to have a large number of parameters, these language models may be considered LLMs. An example GPT-type LLM is GPT-3. GPT-3 is a type of GPT language model that has been trained (in an unsupervised manner) on a large corpus derived from documents available to the public online. GPT-3 has a very large number of learned parameters (on the order of hundreds of billions), is able to accept a large number of tokens as input (e.g., up to 2048 input tokens), and is able to generate a large number of tokens as output (e.g., up to 2048 tokens). GPT-3 has been trained as a generative model, meaning that it can process input text sequences to predictively generate a meaningful output text sequence. ChatGPT is built on top of a GPT-type LLM, and has been fine-tuned with training datasets based on text-based chats (e.g., chatbot conversations). ChatGPT is designed for processing natural language, receiving chat-like inputs and generating chat-like outputs.

A computing system may access a remote language model (e.g., a cloud-based language model), such as ChatGPT or GPT-3 (or GPT-4 or Gemini or Claude etc.), via a software interface (e.g., an application programming interface (API)). Additionally or alternatively, such a remote language model may be accessed via a network such as, for example, the Internet. In some implementations such as, for example, potentially in the case of a cloud-based language model, a remote language model may be hosted by a computer system as may include a plurality of cooperating (e.g., cooperating via a network) computer systems such as may be in, for example, a distributed arrangement. Notably, a remote language model may employ a plurality of processors (e.g., hardware processors such as, for example, processors of cooperating computer systems). Indeed, processing of inputs by an LLM may be computationally expensive/may involve a large number of operations (e.g., many instructions may be executed/large data structures may be accessed from memory) and providing output in a required timeframe (e.g., real-time or near real-time) may require the use of a plurality of processors/cooperating computing devices as discussed above.

Inputs to an LLM may be referred to as a prompt, which is a natural language input that includes instructions to the LLM to generate a desired output. A computing system may generate a prompt that is provided as input to the LLM via its API. As described above, the prompt may optionally be processed or pre-processed into a token sequence prior to being provided as input to the LLM via its API. A prompt can include one or more examples of the desired output, which provides the LLM with additional information to enable the LLM to better generate output according to the desired output. Additionally or alternatively, the examples included in a prompt may provide inputs (e.g., example inputs) corresponding to/as may be expected to result in the desired outputs provided. A one-shot prompt refers to a prompt that includes one example, and a few-shot prompt refers to a prompt that includes multiple examples. A prompt that includes no examples may be referred to as a zero-shot prompt.

Figure 2:
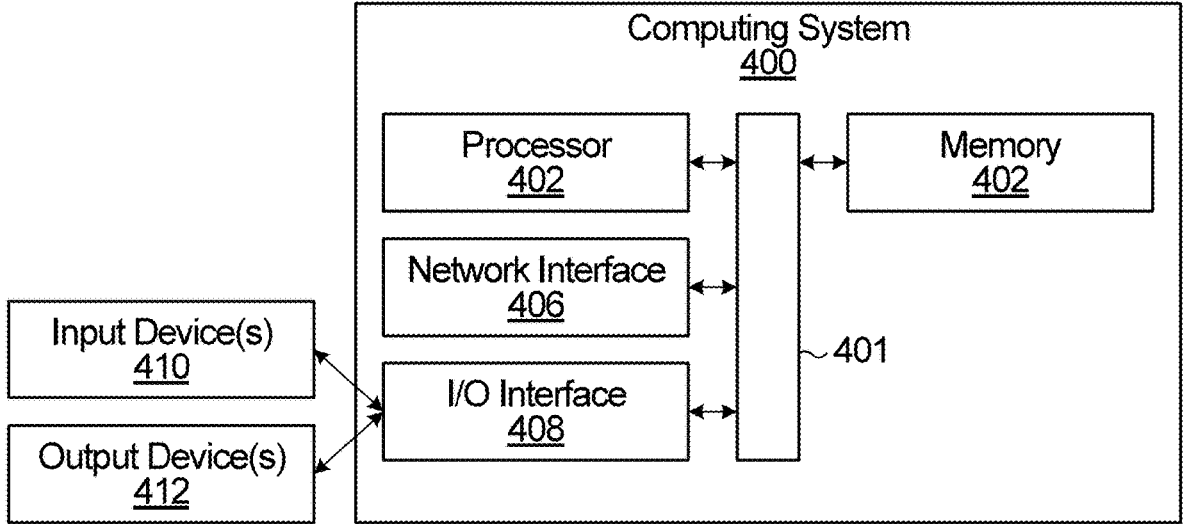
FIG. 2 is a block diagram of an example computing system.

FIG. 2 illustrates an example computing system 400, which may be used to implement examples of the present disclosure, such as a prompt generation engine to generate prompts to be provided as input to a language model such as a LLM. Additionally or alternatively, one or more instances of the example computing system 400 may be employed to execute the LLM. For example, a plurality of instances of the example computing system 400 may cooperate to provide output using an LLM in manners as discussed above.

The example computing system 400 includes at least one processing unit, such as a processor 402, and at least one physical memory 404. The processor 402 may be, for example, a central processing unit, a microprocessor, a digital signal processor, an application-specific integrated circuit (ASIC), a field-programmable gate array (FPGA), a dedicated logic circuitry, a dedicated artificial intelligence processor unit, a graphics processing unit (GPU), a tensor processing unit (TPU), a neural processing unit (NPU), a hardware accelerator, or combinations thereof. The memory 404 may include a volatile or non-volatile memory (e.g., a flash memory, a random access memory (RAM), and/or a read-only memory (ROM)). The memory 404 may store instructions for execution by the processor 402, to the computing system 400 to carry out examples of the methods, functionalities, systems and modules disclosed herein.

The computing system 400 may also include at least one network interface 406 for wired and/or wireless communications with an external system and/or network (e.g., an intranet, the Internet, a P2P network, a WAN and/or a LAN). A network interface may enable the computing system 400 to carry out communications (e.g., wireless communications) with systems external to the computing system 400, such as a language model residing on a remote system.

The computing system 400 may optionally include at least one input/output (I/O) interface 408, which may interface with optional input device(s) 410 and/or optional output device(s) 412. Input device(s) 410 may include, for example, buttons, a microphone, a touchscreen, a keyboard, etc. Output device(s) 412 may include, for example, a display, a speaker, etc. In this example, optional input device(s) 410 and optional output device(s) 412 are shown external to the computing system 400. In other examples, one or more of the input device(s) 410 and/or output device(s) 412 may be an internal component of the computing system 400.

A computing system, such as the computing system 400 of FIG. 2, may access a remote system (e.g., a cloud-based system) to communicate with a remote language model or LLM hosted on the remote system such as, for example, using an application programming interface (API) call. The API call may include an API key to enable the computing system to be identified by the remote system. The API call may also include an identification of the language model or LLM to be accessed and/or parameters for adjusting outputs generated by the language model or LLM, such as, for example, one or more of a temperature parameter (which may control the amount of randomness or "creativity" of the generated output) (and/or, more generally some form of random seed as serves to introduce variability or variety into the output of the LLM), a minimum length of the output (e.g., a minimum of 10 tokens) and/or a maximum length of the output (e.g., a maximum of 1000 tokens), a frequency penalty parameter (e.g., a parameter which may lower the likelihood of subsequently outputting a word based on the number of times that word has already been output), a "best of" parameter (e.g., a parameter to control the number of times the model will use to generate output after being instructed to, e.g., produce several outputs based on slightly varied inputs). The prompt generated by the computing system is provided to the language model or LLM and the output (e.g., token sequence) generated by the language model or LLM is communicated back to the computing system. In other examples, the prompt may be provided directly to the language model or LLM without requiring an API call. For example, the prompt could be sent to a remote LLM via a network such as, for example, as or in message (e.g., in a payload of a message).

Evaluating Confidence in a Classification Performed by a Generative Language Model The LLM discussed above is an example of a generative language model.

As discussed earlier, a general language model, such as an LLM, may be used to classify an input into one of a plurality of categories. For example, the generative language model may be provided with a prompt that includes a query and the prompt may instruct the generative language model to classify the query as ambiguous or unambiguous. The output provided by the generative language model may include "ambiguous query: false", which in this example classifies the query as unambiguous. However, given the machine-learning operation of the generative language model, the output of the generative language model does not represent a definitive statement, but is based on probability computations of the machine learning model. Therefore, the classification may be incorrect, which leads to the downstream technical problems discussed earlier.

In examples below, to try to mitigate the technical drawback above, when a generative language model generates a response that classifies an input, one or more probability values associated with a token that forms the basis of the response may be used to determine a confidence value. The confidence value is indicative of confidence in the classification performed by the generative language model. An action may be taken based on the confidence value, e.g. the action might include stopping generation of output from the generative language model, and/or modifying the output from the generative language model, and/or providing a new input prompt to the generative language model, and/or providing a reply based on the confidence value, etc., depending upon the implementation.

Figure 3:
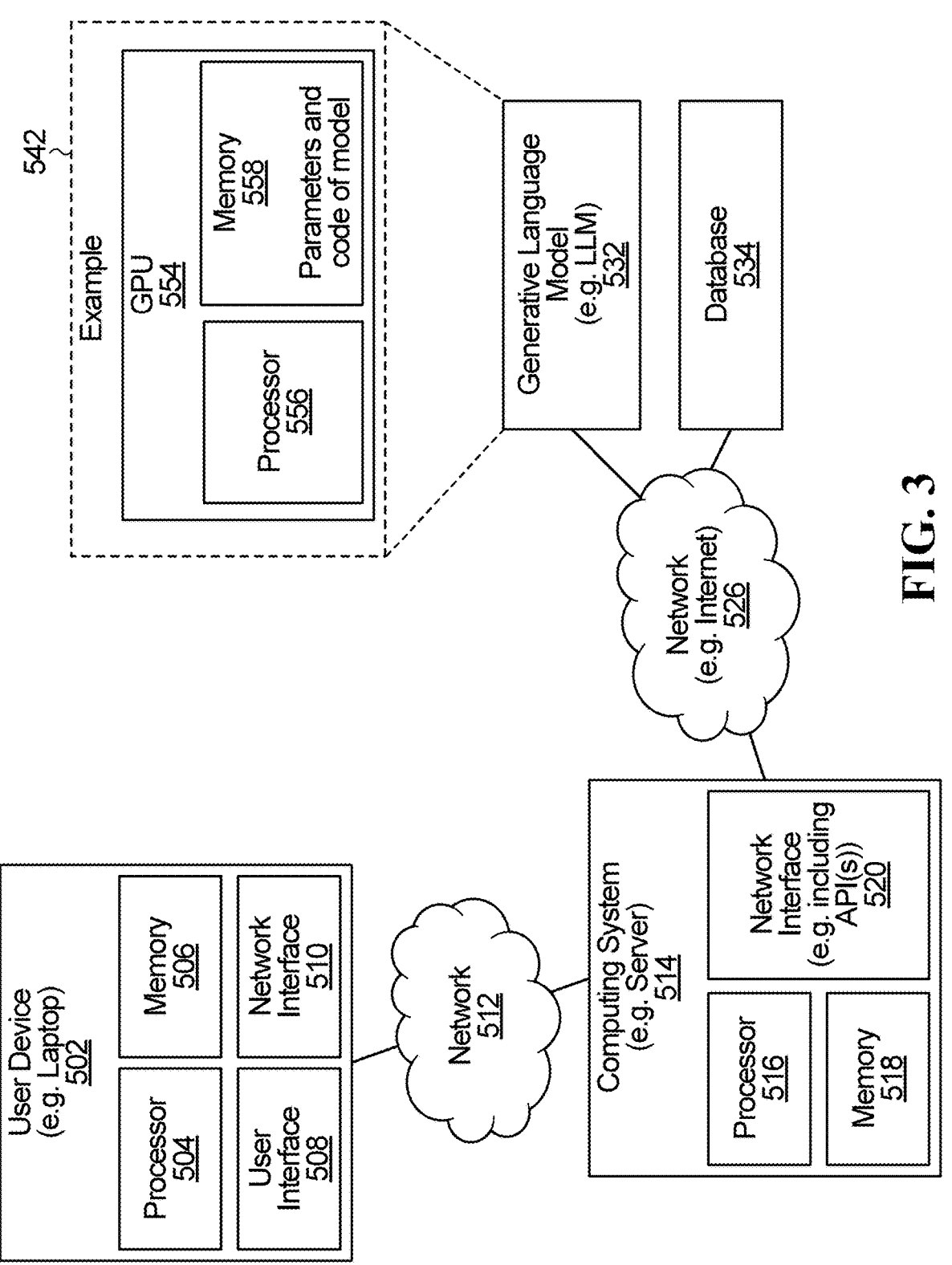
FIG. 3 illustrates an example system for evaluating confidence in a classification performed by a generative language model.

FIG. 3 illustrates one example system for evaluating confidence in a classification performed by a generative language model. The system assumes the scenario of retrieval augmented generation (RAG). However, the methods disclosed herein need not be limited to RAG.

The system includes a user device 502. Only one user device is illustrated, but the system may include multiple user devices. The user device 502 is a device used by a user to communicate with generative language model 532. For example, the user device 502 may be a personal computer, or laptop, or desktop computer, or mobile device such as a tablet or smartphone, or an augmented reality (AR) device, etc., depending upon the implementation. The user device 502 includes a processor 504, memory 506, user interface

508, and network interface 510. The processor 504 controls the operations of the user device 502. The processor 504 may be implemented by one or more processors that execute instructions stored in the memory 506. Alternatively, some or all of the processor 504 may be implemented using dedicated circuitry, such as an application specific integrated circuit (ASIC), a graphics processing unit (GPU), or a programmed field programmable gate array (FPGA). The memory 506 stores information (e.g. content and/or instructions, etc.). The user interface 508 allows the user (e.g. a human) to provide input to and receive output from the user device 502. For example, the user interface 508 may include a display (which may be a touch screen), and/or a keyboard, and/or a mouse, etc. The network interface 510 interfaces with a network 512 to perform communication (transmit/receive) over that network 512. The structure of the network interface 510 will depend on how the user device 502 interfaces with the network. For example, if the user device 502 is a smartphone or tablet, the network interface 510 may comprise a transmitter/receiver with an antenna to send and receive wireless transmissions over the network 512. If the user device 502 is a personal computer connected to the network 512 with a network cable, the network interface 510 may comprise a network interface card (NIC), and/or a computer port (e.g. a physical outlet to which a plug or cable connects), and/or a network socket, etc.

The system of FIG. 3 further includes a computing system 514 that is an intermediary between the user device 502 and the generative language model 532. For example, the computing system 514 may send prompts to the generative language model 532 via an application programming interface (API) on behalf of the user device 502 and transmit responses from the generative language model 532 to the user device 502. In the illustrated example, the user device 502 and computing system 514 communicate over network 512. Network 512 might be, for example, the Internet or an Intranet or local network. The computing system 514 may be (or may be part of) a computing platform that is accessible to the user device 502 and that provides services to the user device 502. For example, the computing system 514 might be a server that is part of the computing platform serving the user device 502.

The computing system 514 includes a processor 516, memory 518, and a network interface (e.g. including one or more APIs) that is used to access generative language model 532 and information in a database 534. The processor 516 controls the operations of the computing system 514. The processor 516 may be implemented by one or more processors that execute instructions stored in the memory 518. Alternatively, some or all of the processor 516 may be implemented using dedicated circuitry, such as an ASIC, GPU, or FPGA. The memory 518 stores information (e.g. content and/or instructions, etc.). The memory 518 may be distributed, e.g. multiple memory locations connected by a network. The network interface 520 interfaces with the generative language model 532 and database 534. For example, the network interface 520 may interface with generative language model 532 by sending prompts over a network 526 to the generative language model 532 and receiving responses back from the generative language model 532. As another example, the network interface 520 may interface with the database 534 by sending a search request (e.g. search term, vector, etc.) over the network 526 to the database 534 and receiving search results back from the database 534. The network 526 may be the Internet, Intranet, local network, or other computer network.

In one implementation, the network interface 520 is implemented via an API that communicates with the generative language model 532 and another or same API that communicates with the database 534. The API that communicates with the generative language model 532 may include an API key to enable the computing system 514 to be identified by the system hosting the generative language model 532. The API call may include an identification of the generative language model 532 to be accessed. The API call may include one or more configuration settings that adjust the output generated by the generative language model 532. Examples of configuration settings may include settings that control the length, style, and/or content output from the generative language model 532, e.g. maximum or minimum number of tokens, and/or randomness of the output (e.g. temperature), and/or a stopping criteria, etc. The API that communicates with the database 534 may include an API key to enable the computing system 514 to be identified by the system hosting the database 534. The API call may include an identification of the database 534 to be accessed. The API call may include one or more terms or embeddings that are used to search the database 534. In some implementations, the network interface 520 need not be or include an API, e.g. it may communicate with the generative language model 532 and/or database 534 via messages sent/received without use of an API, e.g. network messages sent over the Internet. The network interface 520 may be implemented by the processor 516, e.g. by the processor 516 executing instructions that cause the processor 516 to perform the functions of the network interface 520. The network interface 520 may enable the computing system 514 to communicate over network 512 and network 526. The network interface may comprise a network interface card (NIC), and/or a computer port (e.g. a physical outlet to which a plug or cable connects), and/or a network socket, etc.

In a variation of FIG. 3 not illustrated, the computing system 514 does not need to exist or it may be one and the same as the user device 502. In those scenarios, the user device 502 interfaces directly with the generative language model 532 and database 534 over network 526. The network interface 520 would be part of user device 502, e.g. network interface 520 may be network interface 510. The remaining explanation assumes the scenario actually illustrated in FIG. 3, i.e. a computing system 514 separate from the user device 502 and acting as the intermediary. However, it will be appreciated that in all scenarios described herein the operations performed by the computing system 514 could alternatively be performed by the user device 502 in the absence of the separate computing system 514 and/or if the computing system 514 were considered part of or the same as the user device 502, depending upon the implementation.

In another variation of FIG. 3 not illustrated, the generative language model 532 might be stored locally as part of computing system 514, e.g. in memory 518, in which case the network interface 520 might not be needed to access the generative language model 532. If the generative language model 532 is stored locally, it may make it possible or easier to modify the output of the generative language model 532 as the output is being generated, e.g. modify the output mid-stream ("live output") to change the classification from one category to another, thereby impacting subsequent output being generated by the generative language model 532. The database 534 might also or instead be stored locally, e.g. as part of memory 518, in which case the network interface 520 might not be needed to access the database 534.

One example of how the generative language model 532 may be implemented is illustrated in stippled box 542 in FIG. 3. The generative language model 532 may be implemented by a specialized computer processing unit, e.g. one designed to accelerate computer operations of a generative model through parallelization of operations, which may allow for faster execution of the generative language model compared to a more general-purpose processing unit. For example, the specialized processing unit may be a GPU or a tensor processing unit (TPU) or a neural processing unit (NPU) or a hardware accelerator. In the example in stippled box 542 of FIG. 3, there is a specialized processing unit in the form of GPU 554 that includes one or more processing circuits (illustrated as processor 556) and memory 558. The code and parameters of the generative language model 532 are stored in the memory 558 and executed by the processor 556. The specialized processing unit (e.g. GPU 554) may be coupled to/associated with a general-purpose processing unit (not shown), e.g. a computer, central processing unit (CPU), and/or other computing device such as a server. The general-purpose processing unit may handle and/or prioritize requests originating from different requesting entities, provide prompts to the model, receive responses, and formulate and provide those responses to the entities. The structure illustrated in stippled box 542 is just an example. Alternative implementations are possible. For example, in an alternative implementation the generative language model 532 may be executed on a computing device that is not necessarily a specialized circuit like a GPU, e.g. the single computing device may be a powerful general purpose computer that receives the API calls, prioritizes and handles requests, executes the model, and returns responses.

The database 534 is not illustrated in more detail in FIG. 3. However, the database 534 may be implemented by memory (which might be distributed) and includes information that can be searched. A few examples are as follows. In one example, the database 534 stores information, such as articles, journals, books, publications, web pages, lists, guides, references, files, and/or records, etc., or the like. In some examples, some or all of the information is or includes long-form text. In some examples, some or all of the information is embedded such that the database 534 stores a collection of vectors, each vector corresponding to an embedding of respective content, e.g. each vector corresponding to an embedding of a respective different document, article, or passage. Note that "database", as used herein, is referring to a collection of data stored in memory, regardless of how it may be organized or accessed.

In a variation not illustrated in FIG. 3, the database 534 is instead an external searching application, e.g. a search engine that receives a search request (e.g. search term(s)) from the computing system 514 and performs a search, e.g. by crawling through pages of content, and returns results.

During operation of the system of FIG. 3, the user device 502 may provide a query (e.g. a question) to the computing system 514. The computing system 514 may search database 534 to obtain information used to answer the query. The query and information may be incorporated into a prompt along with an instruction, and the prompt may be sent to the generative language model 532. The generative language model 532 returns a response.

Figure 4:
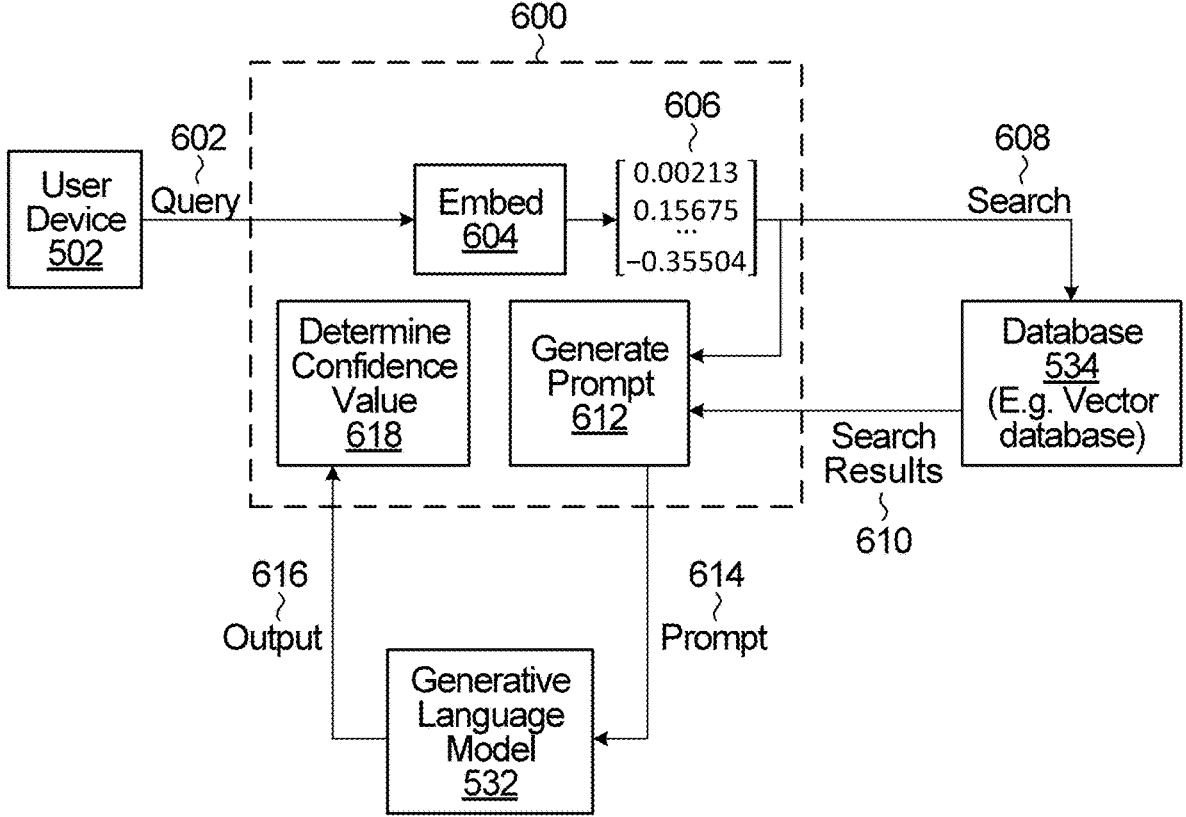
FIG. 4 illustrates example steps that may be performed by a computing system.

One specific example of steps that may be performed by the computing system 514 are illustrated in FIG. 4. The steps performed by the computing system 514 are illustrated in stippled bubble 600. The computing system 514 receives a query 602 from the user device 502. For example, the query might be a question, or a statement, for which the user wants a reply. Assume for the sake of example that the user is trying to build a webpage and the query 602 provided by the user device 502 is "How to put a video on page". The computing system 514 embeds 604 the query 602 to obtain an embedding 606 in the form of a vector, alternatively called an "embedding vector". The embedding 606 may be generated by the computing system 514 accessing or implementing a machine learning model that is trained to embed. As discussed earlier, an embedding is a learned numerical representation (e.g. vector) that captures a semantic meaning of the text segment represented by the embedding. The embedding represents the text segment in a way such that embeddings corresponding to semantically-related text are closer to each other in a vector space than embeddings corresponding to semantically-unrelated text.

After the query 604 is embedded, the embedding 606 is used to search 608 database 534 to retrieve information (referred to in FIG. 4 as "search results 610") relevant to the embedding 606. In the example, the database 534 is a vector database in which each vector is itself an embedding of respective content, e.g. each embedding corresponding to a different document, article, or passage of text. The embeddings in the database 534 will be referred to as "reference embeddings". The search 608 may be a vector search, also sometimes called a vector similarity search. Given that semantically-related text are closer to each other in a vector space, the search may search for reference embeddings that are close to embedding 606 (in the vector space), on the assumption that the content represented by those reference embeddings are pertinent to the query 602. The vector search might be or include, for example, k-nearest neighbour matching, and/or an approximate nearest neighbour search, and/or a cosine similarity search, and/or a dot product search, and/or a fuzzy search method. A vector search is only an example. Alternatively, the searching may be performed in a different manner (e.g. keyword search, similarity search, Internet search engine, etc.), in which case the information in the database 534 is not necessarily stored as embeddings, but may instead be stored as text or another representation.

The purpose of the search is to supplement the query 602 with information that might be relevant to replying to the query 602, so that such information can be provided to the generative language model 532 along with the query 602, to try to assist the generative language model 532 in providing an improved reply (e.g. more accurate and/or reliable). Continuing the example above, assume the query 602 provided by the user device 502 is "How to put a video on page". The database 534 might include a reference embedding that embeds an article explaining how a YouTube™ video can be included in a webpage. This reference embedding may be close to the embedding 606 of the query 602, and returned as the search results 610. The article may then be included in the prompt to the generative language model 532 along with the query 602, which may cause the generative language model 532 to generate a reply to the query 602 that is improved because the prompt has been engineered to include context (the article).

Continuing the example method in FIG. 4, the search results 610 (e.g. the reference embedding corresponding to the article discussed above) are used, along with the embedding 606 of the query 602 to generate a prompt. For example, the query 602 and search results 610 are both incorporated into a prompt either as vectors or mapped back to text representations. The prompt generation 612 may involve mapping both the embedding 606 and reference embedding (search results) back to text, depending upon the implementation. In some implementations, it might be that the input to step 612 is the query 602 directly, rather than its embedding 606, and it might be that the search results 610 input to step 612 is the text corresponding to the reference embedding. For example, a step of mapping the reference embedding back to the text it represents may be performed prior to generating the prompt. As one example, the prompt generated in step 612 might include the following text: "Answer the query using the information. Here is the query: . . . . Here is the information: . . . .". The " . . . " includes the text of the query 602 and the text of the information returned in the search results 610. For example, continuing the example introduced above in which the user is building a webpage, the prompt may include the following: "Answer the query using the information. Here is the query: How to put a video on page. Here is the information: To include a YouTube™ video in a webpage, first go to the YouTube™ video you want to add to your webpage. Then . . . ".

In some implementations, the search results 610 that are incorporated into the prompt 614 are or represent one or more documents. A document might alternatively be called an article. A document may be represented by a single embedding or multiple embeddings. In some implementations, a close or closest vector returned by the search may be associated with/mapped to a document, e.g. the vector may be an embedding representing a summary of the document or a key passage of the document. In some implementations, the search results 610 that are incorporated into the prompt are one or more passages from one or more documents.

The prompt 614 generated in step 612 also includes an instruction to perform at least one classification for an input of the prompt 614. For example, the prompt 614 may ask the generative language model 532 to classify the query 602 as either ambiguous or unambiguous. As another example, the prompt 614 may also or instead ask the generative language model 532 to classify the information (search results) as either sufficient or insufficient to reply to the query 602.

The prompt 614 is transmitted to the generative language model 532, which generates output 616 responsive to the prompt 614. The output 616 includes a response that includes at least one classification that classifies the input of the prompt into a category. As shown at step 618, a confidence value is determined for at least one classification performed by the generative language model 532. The confidence value is indicative of a confidence in the classification performed by the generative language model 532. The confidence value is based on at least one probability value associated with at least one token the forms a basis of the response provided by the generative language model 532. Examples of how to determine the confidence value are discussed in detail herein. After the confidence value is determined, an action may be taken based on the confidence value. The action taken is implementation specific, but might include stopping generation of output from the generative language model 532, and/or modifying the output 616 from the generative language model 532, and/or providing a new input prompt to the generative language model 532, and/or providing a reply to the query 602 based on the confidence value, etc. Example actions are discussed herein in relation to specific example scenarios.

FIG. 5 illustrates an example prompt 614 and an example output 616 from the generative language model 532 responsive to the prompt 614. In the example of FIG. 5, the prompt 614 provides the query and the information based on the search results. As shown at 652, the query in the illustrated example is "How to put a video on page", and as shown at 653 the information is the retrieved article explaining how to include a YouTube™ video in a webpage. As shown at 654, the prompt 614 instructs the generative language model 532 to perform two classifications and provide a response in JavaScript Object Notation (JSON). Specifically, the prompt 614 instructs the generative language model 532 to classify the query as either ambiguous or unambiguous, by outputting a Boolean response of either "true" or "false". The prompt 614 also instructs the generative language model 532 to classify the information retrieved from the search as either sufficient or insufficient to reply to the query, by outputting a Boolean response of either "true" or "false". As shown at 656, the prompt 614 also instructs the generative language model 532 to provide an answer to the query (also in JSON format) if the query is determined to be unambiguous and the information is deemed to be sufficient, i.e. if the results of the classifications are ambiguous_query: false and sufficent_info: true. The prompt 614 may include other input not shown.

The output 616 from the generative language model 532 includes the classification. As shown at 662 and 663, in this example generative language model 532 returns the following output:

```
\n \"ambiguous_query\": false,
\n \"sufficient_info\": true,\n
```

This JSON output classifies the query as unambiguous (\"ambiguous_query\": false) and classifies the information as sufficient to reply to the query (\"sufficient_info\": true).

Because the generative language model 532 classified the query as unambiguous and the information as sufficient to reply to the query, the generative language model 532 continues output generation answering the query, as instructed by the prompt at 656. This answer is not illustrated in example output 616.

Figure 6:
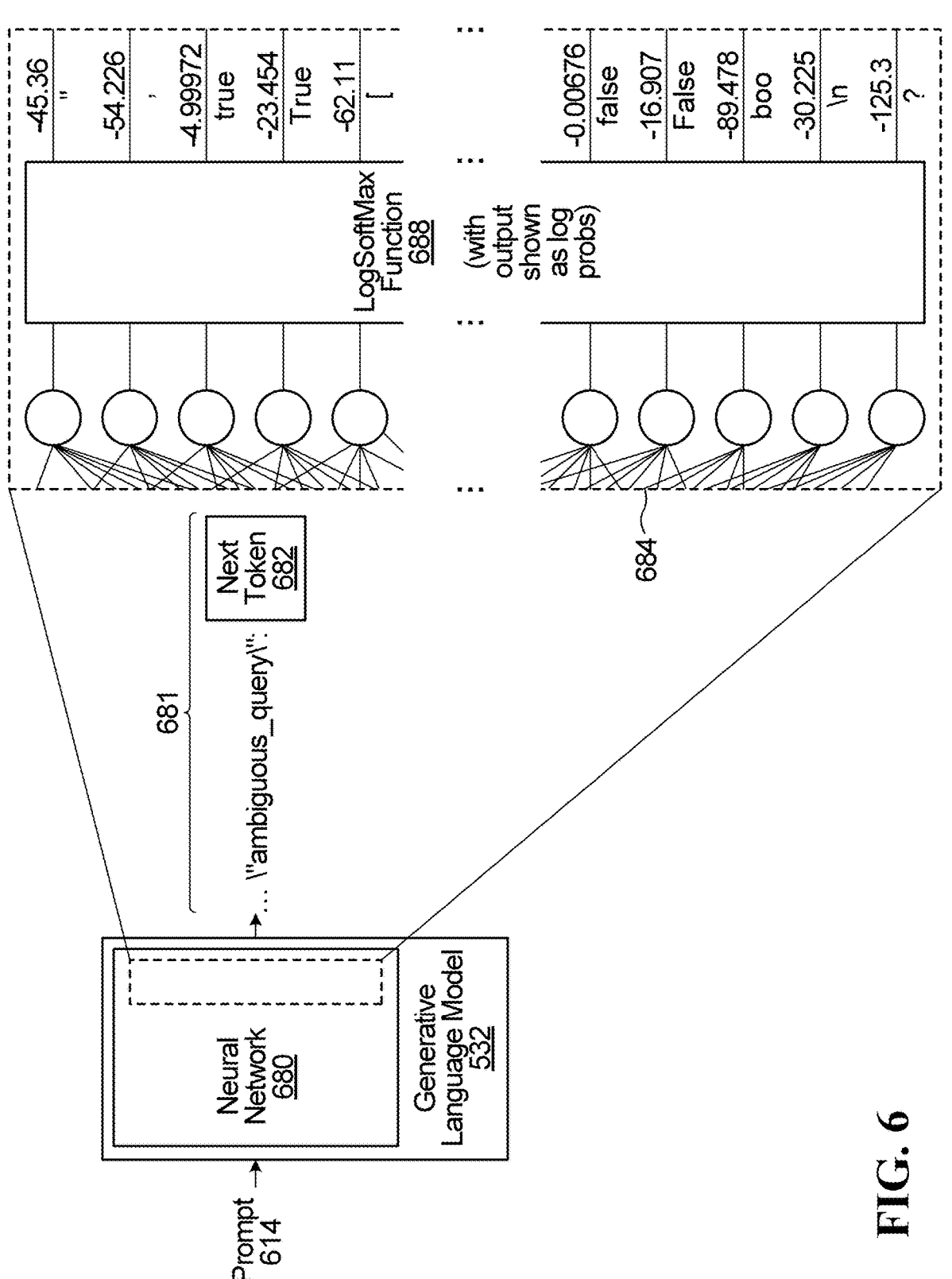
FIG. 6 is an example of a generative language model generating a sequence of tokens.

Consider now the portion of the example output 616 in which the generative language model 532 classifies the query as unambiguous (\"ambiguous_query\": false). The generative language model 532 is a machine learning generative model that outputs a sequence of tokens that forms the basis of the response. That is, the output \"ambiguous_query\": false is formed by a sequence of tokens, each token generated based on the preceding tokens. Turning to FIG. 6, an example of the generative language model 532 generating the sequence of tokens is illustrated. The generative language model 532 may have the example LLM structure described earlier in relation to FIG. 1B, or it may have another structure, e.g. it may only implement a decoder or an encoder, rather than both. The exact structure of the generative language model 532 is implementation specific, although in the example of FIG. 6 it is assumed that the generative language model 532 has at least one neural network 680.

The generative language model 532 receives the prompt 614 and in response generates a sequence of tokens 681. In generating the sequence of tokens, the generative language model 532 needs to generate a next token 682 given one or more preceding tokens already generated. In the illustrated example, the generative language model 532 has already generated a sequence with the immediately preceding tokens being \"ambiguous_query\". The generative language model 532 determines what is the next token 682 given one or more preceding tokens, e.g. given \"ambiguous_query\". The generative language model 532 includes one or more neural networks, although only one is illustrated as neural network 680. As shown in stippled box 684, the neural network 680 includes a layer (e.g. a final layer) in which there is a respective node corresponding to each possible next token that may be output by the generative language model 532. The output from each node is indicative of a probability of the respective token being the next token 682. The value output from each node may be a probability value in the form of a number representing an unnormalized probability, e.g. the value output from each node may be a logit value. The plurality of values output from the layer of nodes may be or form a tensor, e.g. a tensor of logit values. In the illustrated example, the output of the layer is input into a softmax function 688 that maps/scales the numbers into a probability, which may between 0 and 1, although in the illustrated example the probabilities are instead represented as log probabilities, which is why the softmax function 688 is referred to in FIG. 6 as a "logsoftmax" function). That is, for each possible next token there is output a probability value that is a log of the normalized/linear probability between zero and one. The advantage of a log probability (versus a linear probability) is that it may ensure numerical stability, particularly with probabilities near zero. This stability may enhance precision and efficiency in computations, crucial for handling small probabilities and preventing underflow issues. For log probabilities, the closer the number is to zero, the more probable the token. For example, the most probable next token is "false", which has a log probability of −0.00676, whereas the least probable next token (of the ones illustrated) is "?", having a log probability of −125.3.

The next token 682 is selected as one of the tokens typically having a high or highest probability of being the next token. The illustrated example assumes that the next token selected is the one having the highest probability, i.e. the token "false". Therefore, the next token 682 is "false", resulting in the classification \"ambiguous_query\": false shown at 662 of FIG. 5. Returning to FIG. 6, note that the next most probable token is "true", having a log probability of −4.99972. If "true" were selected by the generative language model 532 instead of "false", then the query would instead be classified as ambiguous. Therefore, as mentioned earlier, given the machine-learning operation of the generative language model 532, the output of the generative language model 532 does not represent a definitive statement, but is based on probability computations of the machine learning model. Therefore, the classification may be incorrect, which leads to the downstream technical problems discussed earlier. To try to mitigate this technical drawback, a confidence value may be computed using one or more of the probability values. The confidence value is indicative of confidence in the classification performed by the generative language model 532.

Returning to FIG. 5, the generative language model 532 also returns, as part of its output 616, probability values associated with a token forming the basis of the classification, which in this case is the token "false". The example assumes "false" is represented by a single token output by the generative language model 532. The text "false" corresponds to a token that was selected for output instead of other tokens. As shown at 664, the generative language model 532 returns the probability of the top five tokens that were candidates for that same position, and each of their associated probability values, where the probability values in this example are log probabilities:

24

```
"token": "false", "logprob": −0.00676
"top_logprobs": [
    "token": "false", "logprob": −0.00676,
    "token": "true", "logprob": −4.99972,
    "token": "False", "logprob": −16.907,
    "token": "True", "logprob": −23.454,
    "token": "\n", "logprob": −30.225]
```

That is, when the generative language model 532 completes generation of:

\n \"ambiguous_query\":

and is generating the next token after ":", the generative language model 532 can select any of the possible next tokens that are part of the vocabulary of the generative language model 532 (i.e. any of the tokens shown as possible next tokens in FIG. 6), but only one is selected ("false"), which in this example is the most probable next token. However, the probabilities associated with the next four most probable possible next tokens that could have been selected instead of "false" are returned, as shown at 664 of FIG. 5. Note that returning the probabilities for the top five tokens, as shown at 664 of FIG. 5, is just an example. More or fewer may be returned. For example, for an API call to the generative language model 532 it may be efficient to prune the probabilities to a short list of top candidates. However, if running the generative language model 532 locally, the system 514 may have access to the probability vector of all tokens in the token set for each generation.

The token corresponding to "false" is the most probable (probability value −0.00676), and was the token selected by the generative language model 532. The token corresponding to "true" is an alternative token that was not selected, and happens to be the next most probable token (with probability value −4.99972). A confidence value is determined that is indicative of confidence in the generative language model's determination that the query is unambiguous. That is, a confidence value is determined that is indicative of the classification "false". In one example, the confidence value is, or is based at least in part on, the probability value corresponding to the selected token (i.e. the probability value −0.00676 in the example). In some examples, the confidence value may be computed by performing a comparison between the probability of the selected token and the probability of one or more alternative tokens. Determining the confidence value is illustrated as step 618 of FIG. 4 and some example ways in which the confidence value may be determined are as follows.

In one example, the confidence value is determined by computing a difference between the selected token and the next most probable token. A confidence value computed in this way may sometimes be referred to as the "log odds". In the example, the selected token ("false") has a log probability value of −0.00676, and the next most probable token ("true") has a log probability value of −4.99972. The difference is −0.00676 −−4.99972=4.99296. The larger the difference, the higher the confidence value, i.e. the more confidence there is in the classification. This makes intuitive sense also because, if the selected token is much more probable than the next most probable token, then confidence in the output is higher than if the selected token was only slightly more probable than the next most probable token. In this approach, in some implementations bandwidth may be saved because only two token probabilities need to be returned, not five token probabilities like in the illustrated example.

In another example, the confidence value is determined by computing a difference between the selected token and the next most probable token that corresponds to a different category. The categories are the plurality of possible categories into which the input may be classified. In the example, there are only two categories: true or false. In the example, the second most probable token corresponds to a different category ("true", rather than "false"), but in general the token that corresponds to a different category might be a lower probability, e.g. it might be the third most probable.

In another example, the confidence value is determined as follows. For each category, combine all tokens corresponding to that category and then perform a comparison, e.g. in the example discussed above in relation to FIGS. 5 and 6 there exists an alternative token (not selected) that is a synonym to the selected token. That alternative token is "False" capitalized, having an associated log probability of −16.907. In general, there may be more than one synonym, e.g. "false" (with a whitespace in front of the "f") is another example. The probability values may be combined for each category. For example, assume a category has two log probability values log (p1) and log (p2), e.g. in the example 664 of FIG. 5 the category "false" has log(p1)=−0.00676 corresponding to "false" and log (p2)=−16.907 corresponding to the synonym "False". To obtain the value log (p1+p2) from log p1 and log p2, the following computation may be performed: log(exp(log p1)+exp(log p2)), where "log" is the logarithm function and "exp" is the exponential function. The same combining may be performed for the two probability values corresponding to the category "true", and then the difference between the combined "false" values and the combined "true" values computed or another comparison performed to determine the confidence value. In some implementations, all synonym tokens for true and false may be identified ahead of time, and the generative language model 532 and/or its API may be configured to return a filtered set of tokens consisting of just the true and false tokens. In some implementations, the combining of synonym token probabilities could be done on the generative language model 532 side before sending the log probabilities, such that a returned log probability may be an aggregated/combined probability (e.g. a single log probability representing "false" and all of its synonyms). In some implementations, the combining may be done on the receiving end of an API.

In some examples, the confidence value may be determined by performing a comparison between the probability value associated with the selected token and the probability value associated with an alternative token (where the alternative token might be, for example, a token corresponding to a different category and/or a token having the next highest probability after the selected token). Note that this encompasses examples above, e.g. the comparison may be performed by computing a difference between the probability value associated with the selected token and the probability value associated with the alternative token, where the difference represents the comparison. As another example, the comparison may instead be based on a ratio, e.g. a ratio of the probability of the selected token and the probability of an alternative token, or vice versa, where the ratio represents the comparison. Depending upon the implementation, a ratio of the two probability values may be equivalent to the difference computation.

In another example, a confidence value may be based on an absolute probability value. For example, if the absolute probability value associated with the category "true" was p(true)=0.3, this may be a confidence value. A confidence threshold may be, for example, 0.5. Note that for binary classification, this may be equivalent to log odds, e.g. if log odds between p(true)/p(false) are given, one may derive p(true).

In some implementations there may be more than two categories. In one example, and without loss of generality, assume there are three categories A, B, C, and the generative language model 532 selects category A (the most probable), with category B being second most likely, and category C the third most likely. One or more confidence values may be computed. For example, the log odds versus next category may be computed as log (p(A)/p (B)), the log odds versus the categories may be computed as log (p(A)/(p(B)+p(C))), the absolute within the categories may be computed as log (p(A)/(p(A)+p(B)+p(C))), and the absolute may be computed as log p(A). The confidence value may be (or may be based on) any of these computations.

In the examples above, the response providing the classification is represented by a single token, e.g. the category "false" corresponds to a single token output by the generative language model 532 that maps to the word "false". It might be the case, depending on the particular model of generative language model 532 and its vocabulary, that a category/classification is expressed as a sequence of two or more tokens, e.g. the word "false" might instead comprise a first token corresponding to "fal" followed by a second token corresponding to "se". The computations discussed above still generally apply, but would need to be modified to accommodate a single category/classification corresponding to multiple underlying tokens. For example, the probability corresponding to "fal" is multiplied by the probability corresponding to "se" (or these two probabilities are added, depending upon the implementation, such as whether linear or log probabilities are being implemented), to determine a probability associated with the category "false". This is then compared to a probability associated with the category "true" (which may also be a multiplication or addition of the probabilities of two or more underlying tokens forming the basis "true", e.g. "tr" and "ue").

In some implementations, upon computing the confidence value, it may be determined whether the confidence value satisfies a threshold. The confidence value is indicative of the level of confidence in the generative language model's classification, which in this example is the generative language model's classification of the query as unambiguous (\"ambiguous_query\": false). For example, the higher the confidence value the more confidence there is that the query actually is unambiguous. The threshold may be a value indicative of high (or high enough or suitably high) confidence in the classification. The threshold may alternatively be referred to as a threshold value. Satisfying the threshold means that the confidence value falls within a particular range associated with the high (or high enough or suitably high) confidence, e.g. a range that encompasses all values that exceed the threshold. For example, satisfying the threshold may mean exceeding the threshold. For example, in the example above the difference between the selected token and the next most probable token is −0.00676 −−4.99972=4.99296. If the threshold is 4, then the threshold is satisfied because the confidence value is higher than 4. If the threshold was instead 5, then the threshold is not satisfied. Determining whether the confidence value satisfies the threshold may be implemented by comparing the confidence value to the threshold.

If the confidence value does not satisfy the threshold, then an action may be taken. Examples may include actions that are responsive to the query being considered ambiguous, despite the generative language model 532 classifying the query as unambiguous. Example actions may include one or more of the following.

In one example, the action is or includes providing a reply indicating that the query is ambiguous. For example, the computing system 514 transmits a reply to the user device 502 indicating that the query 602 provided by the user device 502 is ambiguous. The reply might also ask the user to provide a modified query.

In another example, the action is or includes prompting the generative language model 532 to generate one or more questions requesting clarification, and return a clarification question as a reply to the query. The prompt might possibly include the generative language model 532 output modified to change "false" to "true", i.e. to change the output to \"ambiguous_query\": true. For example, the computing system 514 may send a new prompt (different from prompt 614) to the generative language model 532 informing the generative language model 532 that the query 602 was ambiguous and instructing the generative language model 532 to generate a clarification question, e.g. the prompt may be or include: "The query is: How to put a video on page. The query has been determined to be ambiguous, i.e. \"ambiguous_query\": true. Generate a clarification question requesting information that will make the query unambiguous".

The generative language model 532 may generate output responsive to the prompt and thereby generate the clarification question, e.g. the output may generate the following example clarification question: "Are you referring to embedding a video in a webpage?". The computing system 514 may transmit the clarification question as a reply to the user device 502. Once an answer to the clarification question is received from the user device 502, the answer to the clarification question and the original query and/or the clarification question may be provided as a new query to the generative language model 532.

In another example, the action is or includes stopping the generative language model 532 from generating further output because the further output is based on the generative language model 532 classifying the query as unambiguous. For example, as shown at 656 of FIG. 5, the prompt 614 instructs the generative language model 532 to provide an answer to the query if the query is determined to be unambiguous and the information is deemed to be sufficient, i.e. if the results of the classifications are ambiguous_query: false and sufficent_info: true. This is the case, as shown at 662 and 663. However, based on the confidence value not satisfying a threshold in relation to the classification of the query as unambiguous, the generative language model 532 is stopped from generating additional output 616 answering the query. This provides a technical benefit because the additional output is likely a waste, e.g. irrelevant or hallucination since there is not sufficient confidence that the query was clear enough, and so stopping the additional output avoids using up tokens and bandwidth, which are scare resources.

In another example, the action is or includes modifying the output 616 during generation to change the category, e.g. to change the output to \"ambiguous_query\": true, and continue receiving output from the generative language model 532 with the response modified. This modified output may then be used by the computing system 514 as output to form the basis of a reply to the query. For example, although not shown in FIG. 5, the example prompt 614 might include an additional instruction such as "If the query is classified as ambiguous, i.e. \"ambiguous_query\": true, then provide an explanation of what clarification is needed". Then, in operation, when the generative language model 532 is generating the output 616 responsive to the prompt 614, the generative language model 532 generates \"ambiguous_query\": false, as shown at 662. The confidence value for this classification is immediately computed, and it is determined that the confidence value does not satisfy a threshold value of confidence. In response, the word "false" is then changed to "true", so that the output 662 now says \"ambiguous_query\": true. The generative language model 532 continues to generate output 616, but its subsequent output (dependent upon the preceding output) may change, e.g. instead of answering the query it may provide an explanation of what clarification is needed. This example implementation might work best if the generative language model 532 is stored locally, e.g. on computing system 514, to facilitate modifying output of the generative language model 532 mid-stream as output 616 is generated responsive to prompt 614. A technical benefit is provided because the output on the assumption of \"ambiguous_query\": false is likely a waste, e.g. irrelevant or hallucination since there is not sufficient confidence that the query was clear enough, and so modifying the output mid-stream allows for the generative language model 532 to instead provide output that is more useful. It avoids having to transmit a new prompt to the generative language model 532 requesting the clarification question, thereby saving token count and bandwidth, which are scare resources.

The examples discussed above thus far are in relation to the classification shown at 662 of FIG. 5, i.e. the classification of the query as unambiguous (\"ambiguous_query\": false). The techniques described above equally apply to determining a confidence value indicative of confidence in the generative language model's determination that the information is sufficient to reply to the query. In the example, the classification is \"sufficient_info\": true, as shown at 663. The word "true" corresponds to a token that was selected for output instead of other tokens. As shown at 666, the generative language model 532 returns an indication of the top five tokens, and each of their associated probabilities (where the probabilities in this example are log probabilities):

```
"token": "true", "logprob": -0.02535
"top_logprobs": [
    "token": "true", "logprob": -0.02535,
    "token": "false", "logprob": -3.68752,
    "token": "\n", "logprob": -14.521,
    "token": "True", "logprob": -15.868,
    "token": "False", "logprob": -27.983]
```

The confidence value for this classification can be determined in any of the example ways described above. Action may be taken if the confidence value does not satisfy a threshold. Examples may include actions that are responsive to the information being considered insufficient to reply to the query, despite the generative language model 532 classifying the information as sufficient to reply to the query. Example actions may include one or more of the following.

In one example, the action is or includes retrieving additional information, e.g. in the different ways explained later. The additional information may then be used to provide a reply to the query. For example, a new prompt may be sent to the generative language model 532 that is the same as example prompt 614, but that includes the additional information instead of (or in addition to) the original information shown at 653. The output from the generative language model 532 responsive to the prompt may be used to reply to the query 602, assuming the additional information is classified by the generative language model 532 as sufficient to reply to the query, and the associated confidence value satisfies the required threshold of confidence.

In another example, the action is or includes prompting the generative language model 532 to generate output explaining what disclosure is missing from the information to be able to reply to the query. The prompt might possibly include the generative language model 532 output modified to change the classification, e.g. to change the output to \"sufficient_info\": false. For example, the computing system 514 may send a new prompt (different from prompt 614) to the generative language model 532 instructing the generative language model 532 that the information 653 was insufficient to reply to the query 602 and asking the generative language model 532 to provide an output explaining what disclosure is missing from the information to be able to reply to the query, e.g. the prompt may be or include:

> "The query is: How to put a video on page. The information is: To include a YouTube™ video in a webpage, first go to the YouTube™ video you want to add to your webpage. Then, . . . It has been determined that the information is insufficient to reply to the query, i.e. \"sufficient_info\": false. What information is still required to answer the query?".

The generative language model 532 may generate output responsive to the prompt, e.g. the output may be: "To answer the query I still need information on how an inline frame works". The computing system 514 may then use the output to perform further searching, e.g. to obtain information about inline frames. The additional information may then be included in a new prompt that is sent to the generative language model 532, e.g. a new prompt that is the same as example prompt 614, but that includes the additional information (about inline frames) in addition to the original information shown at 653. The output from the generative language model 532 responsive to the prompt may be used to reply to the query.

In another example, the action is or includes stopping the generative language model 532 from generating further output because the further output is based on the generative language model 532 classifying the information as sufficient to reply to the query. For example, as shown at 656 of FIG. 5, the prompt 614 instructs the generative language model 532 to provide an answer to the query if the query is determined to be unambiguous and the information is deemed to be sufficient, i.e. if the results of the classifications are ambiguous_query: false and sufficent_info: true. This is the case, as shown at 662 and 663. However, based on the confidence value not satisfying a threshold in relation to the classification of the information as sufficient, the generative language model 532 is stopped from generating additional output 616 answering the query. This is because the information is deemed to be not sufficient enough given that the confidence value did not satisfy the threshold value of confidence. A technical benefit is provided because the additional output is likely a waste, e.g. irrelevant or hallucination since there is not sufficient confidence that the information is sufficient enough to answer the query, and so stopping the additional output avoids using up tokens and bandwidth, which are scare resources. In some implementations, the generative language model 532 may be prompted to generate output explaining what disclosure is missing from the information to be able to reply to the query. The generative language model 532 may indicate what information is missing, which may be used to perform further searching to obtain the additional information, which may ultimately be used to reply to the query 602, e.g. by forming a new prompt that is the same as example prompt 614, but that includes the additional information in addition to the original information shown at 653.

In another example, the action is or includes modifying the output 616 during generation to change the category, e.g. to change the output to \"sufficient_info\": false, and continue receiving output from the generative language model 532 with the response modified. This modified output may then be used by the computing system 514 to take further action. For example, although not shown in FIG. 5, the example prompt 614 might include an additional instruction such as "If the information is classified as insufficient to reply to the query, i.e. \"sufficient_info\": false, then provide an explanation of what additional information is still needed to answer the query". Then, in operation, when the generative language model 532 is generating the output 616 responsive to the prompt 614, the generative language 532 generates \"sufficient_info\": true, as shown at 663. The confidence value for this classification is immediately computed, and it is determined that the confidence value does not satisfy a threshold value of confidence. In response, the word "true" is then changed to "false", so that the output 6636 now says \"sufficient_info\": false. The generative language model 532 continues to generate output 616, but its subsequent output (dependent upon the preceding output) may change, e.g. instead of answering the query it may provide an explanation of what additional information is still needed to answer the query. This example implementation might work best if the generative language model 532 is stored locally, e.g. on computing system 514, to facilitate modifying output of the generative language model 532 mid-stream as output 616 is generated responsive to prompt 614. A technical benefit is provided because the output on the assumption of \"sufficient_info\": true is likely a waste, e.g. irrelevant or hallucination since there is not sufficient confidence that there is enough information to answer the query, and so modifying the output mid-stream allows for the generative language model 532 to instead provide output that is more useful. It avoids having to transmit a new prompt to the generative language model 532 requesting the additional information, thereby saving token count and bandwidth, which are scare resources. In some implementations, the output may be used to perform further searching to obtain the additional information, which may ultimately be used to reply to the query 602, e.g. by forming a new prompt that is the same as example prompt 614, but that includes the additional information in addition to the original information shown at 653.

The example methods described above are all in the context of retrieval augmented generation (RAG), and in particular they are all in the context of the specific example illustrated in FIGS. 3 to 6. However, it will be appreciated that the techniques described herein are not limited to RAG or the RAG example above. Anytime a generative language model 532 performs a classification, a confidence value indicating confidence in that classification may be determined in the manner shown herein, and an action may be taken based on the confidence value. For example, consider a completely different scenario, as follows. A generative language model is used to perform content moderation. The prompt includes a user comment and an instruction for the generative language model to classify the user comment as offensive, irrelevant, or appropriate. The generative language model returns "appropriate". That is, of the three possible categories into which the user comment can be classified, the generative language model returns a response classifying the user comment into the category "appropri-ate". Assume for ease of explanation that "appropriate" is represented by a single token having a linear probability (between 0 and 1) of 0.55, and the next most probable token not selected (that could have been selected instead of "appropriate") corresponds to "offensive" and has a prob-ability of 0.42. The probability 0.42 is not much lower than 0.55, indicating that the generative language model was not as confident in its decision. Assume the confidence value is computed as a ratio between the two: 0.55/0.42=1.31. Assume the ratio must meet a threshold of at least 2 to confidently classify the content as "appropriate". The thresh-old is not satisfied, and so an action is taken such as replying to the query that requested the classification with an indi-cation that the comment should be reviewed by a human. This example assumes linear probability values. Alterna-tively, log probability values may be used, in which case the confidence value might instead be a difference between the two log probability values rather than a ratio.

FIG. 7 illustrates a method performed by a computer, such as computing system 514, according to one example. At step 702, a prompt is provided to a generative language model. The prompt instructs the generative language model to generate a response that classifies an input of the prompt into one category of a plurality of categories. For example, in the example of FIG. 5, the prompt 614 includes the query 652 as an input and the prompt 614 instructs the generative language model to classify the query into one of two categories: ambiguous or unambiguous. As another example, in the content moderation scenario described above, the input includes a user comment, and the prompt includes the user comment as input and the prompt instructs the generative language model to classify the user comment into one of three categories: appropriate, irrelevant, or offensive.

At step 704, a response is received from the generative language model. The response is based on one or more tokens selected by the generative language model. For example, in the example explained earlier in relation to FIGS. 5 and 6, the response classifies the query as unam-biguous, as shown at 662 of FIG. 5, and that response may be based on a token corresponding to "false" that is selected by the generative language model, as explained earlier in relation to FIGS. 5 and 6.

At step 706, for a selected token that forms a basis of the response, the computer receives, from the generative lan-guage model, a probability value associated with the selected token and a probability value associated with an alternative token that was not selected by the generative language model to form the basis of the response. The alternative token is a token that could have been selected by the generative language model, but that was not selected and instead in its place the selected token was selected. In the example in FIG. 5 at 664, the selected token that forms the basis of the response is "false", and it associated probability value is −0.00676. An alternative token that was not selected by the generative language model (i.e. an alternative token that could have been selected instead of the selected token to form the basis of the response, but that was not selected) is any of the four alternative tokens at 664 of FIG. 5, i.e. "true", "False", "True", and "n". Each of these alternative tokens has an associated probability value that is also received from the generative language model. Specifically, "true" has associated probability value −4.99972, "False" has associated probability value −16.907, "True" has asso-ciated probability value −23.454, and "\n" has associated probability value −30.225.

At step 708, a confidence value is determined using the probability value associated with the selected token and the probability value associated with the alternative token. For example, the confidence value may be determined in any of the ways explained earlier. As one example, the confidence value may be the difference between the probability value of the selected token and the probability value of the alternative token.

At step 710, a reply to the query is provided that is dependent upon the confidence value. For example, the confidence value may be compared to a threshold that, if satisfied, means that there is sufficient confidence in the classification. If the confidence value satisfies the threshold, then the reply may be based on the output of the generative language model. However, if the confidence value does not satisfy the threshold, then the reply may indicate this and/or the reply may request additional clarification and/or addi-tional searching may be performed and used to form the basis of the reply, etc. As explained earlier, "satisfying a threshold" means the confidence value falls within a par-ticular range associated with high (or high enough or suit-ably high) confidence, e.g. a range that encompasses all values that exceed the threshold. For example, satisfying the threshold may mean exceeding the threshold. For example, if the confidence value is 4.99296 and the threshold is 4, then the threshold is satisfied because the confidence value is higher than 4, that is the confidence value falls within a range that exceeds the threshold. However, if the threshold was instead 5, then the threshold is not satisfied because the confidence value does not fall inside the range of values that exceeds the threshold. Determining whether the confidence value satisfies the threshold may be implemented by com-paring the confidence value to the threshold.

In some implementations of the method of FIG. 7, the alternative token that was not selected (in step 706) may correspond to another category of the plurality of categories. For example, in the example discussed above in which the query is classified as unambiguous (\"ambiguous_query\": false), the alternative token may be a token that corresponds to the query instead being classified as ambiguous (\"am-biguous_query\": true). That is, in this example, the selected token corresponds to the category "false", and the alternative token corresponds to the category "true".

In some implementations of the method of FIG. 7, the alternative token that was not selected (in step 706) may have a next highest associated probability after the selected token. For example, in the example discussed above in which the query is classified as unambiguous (\"ambiguous-_query\": false), the selected token ("false") has a probabil-ity value of −0.00676, and the unselected token having the next highest probability is "true" having probability value −4.99972. Therefore, the unselected token "true" may be the alternative token of FIG. 7.

In some implementations of the method of FIG. 7, there might only be two categories, and the response classifies the input into one of the two categories. This is the case in the example explained above in which the query is classified into either the category ambiguous (\"ambiguous_query\": true) or unambiguous (\"ambiguous_query\": false). How-ever, in other implementations there may be more catego-ries, e.g. in the user comment moderation example the user comment can be classified into one of three categories: appropriate, irrelevant, or offensive.

In implementations of the method of FIG. 7 in which there are only two categories, the response received at step 704 might only have one of two response values. The two response values might be a first response value that corresponds to the selected token and a second response value that corresponds to the alternative token. For example, in the example discussed above in which the query is classified as unambiguous (\"ambiguous_query\": false), the selected token has a first response value ("false"), and the alternative token may be the token corresponding to "true", which is the second response value.

In some implementations of the method of FIG. 7, in step 708 determining the confidence value may include or consist of performing a comparison between the probability value associated with the selected token and the probability value associated with the alternative token. The confidence value may be based on the comparison. For example, the comparison may be computing a difference between the probability value associated with the selected token and the probability value associated with the alternative token (e.g. the difference −0.00676 −−4.99972=4.99296 described earlier). In another example, the comparison might instead be based on a ratio, e.g. a ratio of the probability of the selected token and the probability of the alternative token, or vice versa.

In some implementations of the method of FIG. 7, the category into which the input is classified is a first category, the alternative token corresponds to a different second category, and the method may include the following steps. For the selected token that forms the basis of the response, receiving, from the generative language model: (i) an indication of two or more alternative tokens, including the alternative token, that were not selected to form the basis of the response, and (ii) for each of the alternative tokens a respective probability value. As an example, these may be the alternative tokens and associated probabilities returned at 664 of FIG. 5. In this example, there are four alternative tokens: "true" having associated probability value −4.99972, "False" having associated probability value −16.907, "True" having associated probability value −23.454, and "\n" having associated probability value −30.225. The method may further include categorizing each of one or more of the alternative tokens into a respective category of the plurality of categories. For example, in the example there are two categories (false and true). "False" may be categorized into the false category, and "true" and "True" may each be categorized in the true category. The method may further include determining a first category probability value that is either: (i) obtained by combining the probability value associated with the selected token with at least one other probability value associated with at least one alternative token categorized into the first category, or (ii) equal to the probability value associated with the selected token responsive to none of the alternative tokens being categorized into the first category. For example, for the first category ("false"), the probability value associated with the selected token (−0.00676) may be combined with the probability value associated with the alternative token "False" (−16.907). For example, the combining may be the computation log(exp(log p1)+exp(log p2)), where "log" is the logarithm function, "exp" is the exponential function, log p1 is −0.00676 and log p2 is −16.907. The method may further include determining a second category probability value that is either: (i) obtained by combining the probability value associated with the alternative token with at least one other probability value associated with at least one other alternative token categorized into the second category, or (ii) equal to the probability value associated with the alternative token responsive to none of the other alternative tokens being categorized into the second category. For example, for the second category ("true"), the probability value associated with the alternative token "true" (−4.99972) may be combined with the probability value associated with the other alternative token of this category "True" (−23.454). For example, the combining may be the computation log(exp (log p1)+exp(log p2)), where "log" is the logarithm function, "exp" is the exponential function, log p1 is −4.99972 and log p2 is −23.454. The method may further include performing a comparison between the first category probability value (log(exp(−0.00676)+exp(−16.907)) in the example) and the second category probability value (log(exp (−4.99972)+exp(−23.454)) in the example). The confidence value may be based on the comparison, e.g. based on a difference between the first and second category probability values, or based on a ratio of the first and second category probability values, etc.

In some implementations of the method of FIG. 7, providing the reply at step 710 may include providing the response of the generative language model along with information generated based on the confidence value. For example, in the example discussed above in which the query is classified as unambiguous (\"ambiguous_query\": false), the reply may be the reply to the query generated as part of example output 616, with an indication of confidence in the reply, where the indication of confidence in the reply is based on the confidence value.

In some implementations of the method of FIG. 7, the prompt of step 702 is a first prompt, and providing the reply in step 710 includes: responsive to the confidence value of step 708 not satisfying a threshold, providing a second prompt to the generative language model, and then providing a reply based on output from the generative language model responsive to the second prompt. For example, the second prompt may ask the generative language model to provide output that can be used to return to the user (e.g. a clarification question), and that output (e.g. clarification question) may be the reply. As another example, the second prompt may ask the generative language model to determine what additional information is needed, the response from the generative language model may be used to perform further searching, and the results from the additional searching may be incorporated into a new prompt. The new prompt is provided to the generative language model, and responsive to the new prompt the generative language model provides output that may form the basis of the reply to the user. In some implementations, the second prompt indicates, to the generative language model, that the input is classified into another category different from the category into which the input was classified by the response. For example, the input may include a query, the response may classify the query as unambiguous, but the second prompt indicates that the query is ambiguous.

In some implementations of the method of FIG. 7, providing the reply at step 710 may include the following step. Responsive to the confidence value not satisfying a threshold, modifying the response output by the generative language model to classify the input into another category different from the category into which the input was originally classified by the response. Then generation of output may be continued from the generative language model with the response modified. A reply may then be provided based on the output from the generative language model with the response modified. An example is explained earlier in which the output of the generative language model 532 is modified mid-stream as output 616 is generated responsive to prompt 614 in order to change \"ambiguous_query\": false to \"ambiguous_query\": true.

In some implementations of the method of FIG. 7, the input of the prompt is the query, the prompt instructs the generative language model to classify the query into one of two categories, where a first category of the two categories corresponds to the query being unambiguous, and a second category of the two categories corresponds to the query being ambiguous. The response classifies the query into the first category corresponding to the query being unambiguous. The selected token forms the basis of the response classifying the query as unambiguous, and the alternative token corresponds to the query being classified as ambiguous. This is the case in the example of FIG. 5 in which the query is classified as unambiguous at 662 by the output \"ambiguous_query\": false, and the selected token corresponds to this classification (where the selected token corresponds to "false"). Assuming the alternative token is the unselected token having the next highest probability, the alternative token is "true", which corresponds to the query being classified as ambiguous.

In some implementations of the method of FIG. 7, the input of the prompt is the query and information, and the prompt instructs the generative language model to classify the information into one of two categories, where a first category of the two categories corresponds to the information being sufficient to reply to the query, and a second category of the two categories corresponds to the information being insufficient to reply to the query. The response classifies the information into the first category corresponding to the information being sufficient to reply to the query, and the selected token forms the basis of the response classifying the information as sufficient to reply to the query. The alternative token corresponds to the information being insufficient to reply to the query. This is the case in the example of FIG. 5 in which the information is classified as sufficient at 663 by the output \"sufficient_info\": true, and the selected token corresponds to this classification (where the selected token corresponds to "true"). Assuming the alternative token is the unselected token having the next highest probability, the alternative token is "false", which corresponds to the information being classified as insufficient.

Note that the method of FIG. 7 and its variations/implementations described above are not limited to RAG or the RAG example of FIGS. 3 to 6, but apply in any scenario in which a generative language model is being used to classify an input.

Technical benefits of some implementations include the following. Given the machine-learning operation of the generative language model, the output of the generative language model does not represent a definitive statement, but is based on probability computations of the machine learning model. Therefore, the classification may be incorrect, which leads to the downstream technical problems discussed earlier. In particular, the generative language model will typically generate additional output based on the classification, and if there is not confidence in the classification the output provided by the generative language model is likely to be hallucination or irrelevant. This can result in additional prompts to the generative language model, which has a material impact, not just because of the additional computation power/operations, but because a generative language model is a precious computing resource often having a token limit and/or a limit on how many prompts can be sent to generative language model. The waste of tokens and/or wasted prompts may lead to slow performance, e.g. due to a delay resulting from a token limit being exceeded. There is also impact on machine-user interaction. However, by determining the confidence value using token probabilities, as described above, a confidence in the classification can be determined. If there is not enough confidence in the classification (e.g. the confidence value does not satisfy a threshold), then action may be taken, as described above. The action may mitigate hallucination, e.g. by stopping the subsequent generative language model output and prompting the generative language model to instead provide other information (e.g. a clarification question), or by changing the classification in the generative language model output thereby positively influencing subsequent generative language model output. Tokens and/or prompts are not wasted on hallucinated or irrelevant output. Also, machine-user interaction is improved because the reply to the end user will be improved by dynamically performing the action based on the confidence value. The functioning of the machine-learning based computer system is thereby improved compared to conventional systems in which the machine learning operation would result in hallucination or irrelevant output, leading to wasted tokens and/or wasted prompts and poor machine-user interaction.

Retrieving Additional Information to Answer a Query

In a retrieval augmented generation (RAG) scenario, such as the illustrated example of FIGS. 3 and 4, information may be retrieved and used to reply to a query. The generative language model may be instructed to generate a response classifying the retrieved information into one of a plurality of categories related to whether or not the information is sufficient to reply to the query. In the example prompt and generative language model in FIG. 5, there are two categories: the information is either classified as sufficient to reply to the query (\"sufficient_info\": true) or insufficient to reply to the query (\"sufficient_info\": false). In the example output 616, the information is classified as sufficient to reply to the query, as shown at 663 (\"sufficient_info\": true). In general, there may be other categories (e.g. the generative language model outputs one of three indications: sufficient, insufficient, or unsure). In a situation in which the generative language model classifies the information as sufficient to reply to the query (e.g. \"sufficient_info\": true, as shown at 663), a confidence value may be computed that is indicative of confidence in the generative language model's classification. The confidence value may be (or be based on) the probability associated with one or more tokens forming the basis of the response (e.g. the log probability of the token corresponding to "true"). In the example of FIG. 5, the log probability of "true" is −0.02535, and the confidence value may be that value or based on that value. The confidence value might be determined using the probability value (e.g. log probability) associated with the selected token ("true", −0.02535) and a probability value (e.g. log probability) associated with an alternative token not selected by the generative language model to form the basis of the response (e.g. "false", −3.68752). The confidence value may be determined in any of the ways described earlier.

Upon computing the confidence value, if the confidence value does not satisfy a threshold, then an action may be taken. Examples include actions that are responsive to the information being classified as insufficient to reply to the query, despite the LLM classifying the information as being sufficient. The actions may include one or more of the following described earlier in detail above, but summarized as follows:

Obtain additional information, e.g. in the different ways explained below.

Prompt the generative language model to generate output explaining what disclosure is missing from the information to be able to reply to the query.

Stop the generative language model from generating further output (because the further output is based on the generative language model classifying the information as being sufficient to reply to the query, but the information is deemed to be not sufficient enough).

Modify the generative language model output to change the classification (e.g. to change the output to \"suffi-cient_info\": false, as described above), and continue receiving output from the generative language model with the response modified. Use this output to form the basis of the reply to the query.

If the action includes obtaining additional information, the following are some example ways this may be implemented. In the examples below, the "first information" refers to the information that was originally obtained and classified by the generative language model (e.g. information 653 in the example of FIG. 5), and the "second information" refers to or includes the additional information.

In one example, the first information may be first search results from searching a database (e.g. database 534), and the second information may be or include different second search results from searching the database. For example, the second information may be or include other relevant search results not included in the first information or different search results from modifying the searching technique (e.g. remove a word from the query to broaden it, and then search based on the broadened query).

In another example, the first information may be search results from searching a first database (e.g. database 534), and the second information may be or include search results from searching a second database (e.g. another database different from database 534). In some cases, the second database might include additional or more content, e.g. the first database is a database of medical journals and the second database is a database including all health-related websites on the internet.

In another example, the second information might include a summary of the first information or capture parts of the first information that are relevant to the query. For example, the generative language model may be prompted to sum-marize or extract passages from the first information that are relevant to the query, and the second information may include the output of the generative language model (that summarizes or extracts passages from the first information that are relevant to the query) along with results from additional searching.

In some implementations, the generative language model may be instructed to generate a response classifying the second information into one of a plurality of categories related to whether or not the second information is sufficient to reply to the query. Assuming the second information is also classified as sufficient, the confidence value for that classification may be determined. If the confidence value satisfies the threshold, the reply to the query may be provided by the generative language model using the second information. Otherwise, further searching might be performed, and/or a reply provided asking for clarification or more detail. For example, the first information may be the information 653 of FIG. 5 providing an explanation of how to include a YouTube™ video in a webpage. This information may be a result of a search from database 534, as explained earlier in relation to FIG. 4. The second information may be the first information 653 (or a summary of the first information 653 provided by the generative language model) combined with another article obtained from further searching, e.g. an article on inline frames. A prompt may be sent to the generative language model that is the same as example prompt 614 of FIG. 5, but with the second information at 653 instead of the first information. The output from the generative language model may classify this second information as sufficient to reply to the query. A confidence value may be determined, e.g. based on the probability value associated with the token "true" in the classification \"sufficient_info\": true. The confidence value may indicate a high level of confidence in the classification such that a threshold value of confidence is satisfied (e.g. the probability value associated with the token "true" may be high, and/or the probability value associated with the alter-native unselected token "false" may be much lower than the probability value associated with "true"). The output answer from the generative language model may then be provided as the reply. In a variation, the process of obtaining further search results, determining the corresponding confidence value, and performing further searching may be iteratively repeated until the confidence value satisfies the threshold that the information is sufficient and/or until the confidence value reaches a peak or plateaus.

Note that the searching might be vector searching, as in the example of FIG. 4, or it could be other forms of searching, e.g. keyword searching, using a search engine, etc. Combinations of different forms of searching are also possible. For example, the searching may initially be a keyword search and subsequently changed to a vector simi-larity search if the confidence value associated with the classification "sufficient query" does not satisfy the thresh-old.

FIG. 8 illustrates a method performed by a computer, e.g. computing device 514, according to one example. At step 742, a prompt is provided to a generative language model. The prompt includes first information, and the prompt instructs the generative language model to generate a response that classifies the first information into one of a plurality of categories. The plurality of categories includes a category corresponding to the first information being suffi-cient to reply to a query. An example is illustrated in FIG. 5 in which prompt 614 includes information 653 (example of the "first information"), and at 654 the prompt instructs the generative language model to generate a response that classifies the information 653 as either sufficient or insuffi-cient to reply to the query 652 by outputting either suffici-ent_info: true or sufficient_info: false. In this example, there are two categories (sufficient_info: true and sufficient_info: false), and one of the categories (sufficient_info: true) cor-responds to the information being sufficient to reply to the query.

At step 744, a response is received from the generative language model. The response classifies the first information into the category corresponding to the first information being sufficient to reply to the query. The response is based on one or more tokens selected by the generative language model. An example is illustrated in FIG. 5 in which example output 663 includes the response \"sufficient_info\": true, which classifies the first information 653 as sufficient to reply to the query 652. The response is based on at least one token that corresponds to the word "true".

At step 746, for a token that forms a basis of the response, the computer (e.g. computing system 514) receives, from the generative language model, a probability value associated with the token. An example is illustrated in FIG. 5 in which the token "true" in the response \"sufficient_info\": true is associated with a log probability of −0.02535.

At step 748, a confidence value is determined using at least the probability value associated with the token. Continuing the example in FIG. 5, the confidence value may be the probability value associated with the token "true" (i.e. probability value −0.02535), or it may be based on both that probability value and a probability value of an unselected alternative token, e.g. the confidence value may be the difference between the probability value associated with the token "true" (−0.02535) and the probability value associated with the unselected alternative token "false" (−3.68752), i.e. −0.02535 −−3.68752=3.66217. The confidence value may be computed in any of the ways explained earlier.

The confidence value may be compared to a threshold that, if satisfied, means that there is sufficient confidence in the classification. As explained earlier, "satisfying a threshold" means that the confidence value falls within a particular range associated with high (or high enough or suitably high) confidence, e.g. a range that encompasses all values that exceed the threshold. Therefore, not satisfying the threshold means that the confidence value does not fall within the particular range. Not satisfying the threshold means that there is not high enough confidence in the classification performed by the generative language model. Determining whether the confidence value satisfies the threshold may be implemented by comparing the confidence value to the threshold.

At step 750, responsive to the confidence value not satisfying the threshold, second information may be obtained and used to reply to the query. The second information may be or include additional information obtained, at least in part, from additional searching Examples of how the second information may be obtained are described above. The second information may be used to reply to the query in any of the example ways described above. As one example, the second information may be information from additional searching and may optionally also include the first information (e.g. information 653) or a summary of or example passages from the first information. The second information may then be used to construct a prompt like example prompt 614, but with the first information 653 replaced with the second information. Assuming the generative language model still classifies the second information as sufficient to reply to the query, the reply may be the output provided by the generative language model that answers the query.

In some implementations of the method of FIG. 8, the prompt of step 742 is a first prompt, and using the second information to reply to the query in step 750 involves: including the second information in a second prompt to the generative language model, and replying to the query based on output of the generative language model responsive to the second prompt. In the example of FIG. 5, the first prompt is example prompt 614, the first information is information 653, and the second information may be both: (i) additional information obtained by further searching, and (ii) the first information 653 or a summary of or example passages from the first information 653. A second prompt may be sent to the generative language model that is the same as the example prompt 614, but with the first information 653 replaced with the second information. The output from the generative language model responsive to the second prompt may then be used to reply to the query.

In some implementations of the method of FIG. 8, the response in step 744 is a first response, the token in step 746 is a first token, the probability value of step 746 is a first probability value, the confidence value of step 748 is a first confidence value, and the method of FIG. 8 may further include the following steps. A second prompt may be transmitted to the generative language model, the second prompt instructing the generative language model to generate a second response that classifies the second information. A second response may be received from the generative language model, the second response classifying the second information into the category corresponding to the second information being sufficient to reply to the query. For a second token that forms a basis of the second response, there may be received, from the generative language model, a second probability value associated with the second token. A second confidence value may be determined using at least the second probability value associated with the second token. Using the second information to reply to the query may then be responsive to the second confidence value satisfying the threshold. In the example of FIG. 5, the first prompt is example prompt 614, the first information is information 653, and the second information may be both: (i) additional information obtained by further searching, and (ii) the first information 653 or a summary of or example passages from the first information 653. A second prompt may be sent to the generative language model that is the same as the example prompt 614, but with the first information 653 replaced with the second information. A second response may be received responsive to the second prompt that classifies the second information as sufficient to reply to the query 652, e.g. \"sufficient_info\": true. For the token corresponding to "true", the probability value (the "second probability value" referred to above) is also returned from the generative language model, which is used to determine a confidence value (the "second confidence value" referred to above). The confidence value is compared to the threshold, and if the confidence value exceeds the threshold, then the threshold is satisfied. The reply to the query 652 may then be based on the output of the generative language model responsive to the second prompt.

In some implementations of the method of FIG. 8, the first information may be based on search results from searching a collection of data (e.g. in a database, such as database 534). In some implementations of the method of FIG. 8, the second information may be based on different search results from searching the collection of data (e.g. from searching database 534 with a different or modified query) or from searching a different collection of data (e.g. from searching another database or from Internet searching).

In some implementations of the method of FIG. 8, the query is converted into an embedding vector, and searching is performed by using the embedding vector to search a collection of vectors representing embedded information. An example is illustrated in FIG. 4 in which query 602 is converted into an embedding vector 606 and used to search a collection of vectors in database 534.

In some implementations of the method of FIG. 8, the method may include instructing the generative language model to generate content summarizing the first information or capturing parts of the first information that are relevant to the query, and in response receiving the content output from the generative language model. The content may then be included as part of the second information.

In some implementations of the method of FIG. 8, responsive to the confidence value not satisfying the threshold, the computer (e.g. computing system 514) may iteratively perform the following steps for each iteration: (1) obtain new information and provide the new information to the generative language model; (2) receive a corresponding reply from the generative language model that classifies the new information as being sufficient; (3) for a token that forms the basis of the corresponding reply: receive, from the generative language model, a respective probability value associated with the token; (4) determine a corresponding confidence value using the respective probability value; and (5) responsive to the corresponding confidence value still not satisfying the threshold, performing a next iteration. In the final iteration, the corresponding confidence value satisfies the threshold. The new information obtained in the final iteration is the second information that is used to reply to the query. In this way, additional searching may be repeatedly performed until there is high enough confidence (the confidence value satisfies the threshold) that the information is sufficient to reply to the query. That information may then be used to reply to the query.

In some implementations of the method of FIG. 8, in step 746 the token that forms the basis of the response is a selected token, and the method further includes receiving, from the generative language model, a probability value associated with an alternative token that was not selected by the generative language model to form the basis of the response. The confidence value may then be determined using the probability value associated with the selected token and the probability value associated with the alternative token. For example, in the example of FIG. 5 the response classifies the information 653 as \"sufficient_info\": true, as shown at 663. The token that forms the basis of that response performing the classification is the token corresponding "true", i.e. the selected token. It has an associated probability value −0.02535. An alternative token that was not selected includes any of the alternative tokens shown at 666 that were not selected, i.e. "false" having associated probability value −3.68752, "\n" having associated probability value −14.521, "True" having associated probability value −15.868, and "False" having associated probability value −27.983. The confidence value may be determined using the probability value associated with the selected token (−0.02535) and the probability values of one or more of the alternative tokens in any of the ways described earlier. For example, the confidence value may be determined by performing a comparison between the probability value associated with the selected token and the probability value associated with an alternative token. The confidence value may be based on the comparison. For example, the comparison may be computing a difference between the probability value associated with the selected token and the probability value associated with an alternative token (e.g. the difference −0.02535 −−3.68752=3.66217, where in this example the alternative token is the next most likely token, but in general that need not be the case). In another example, the comparison might instead be based on a ratio, e.g. a ratio of the probability of the selected token and the probability of an alternative token, or vice versa.

In some implementations of the method of FIG. 8, the alternative token that was not selected corresponds to another category of the plurality of categories. For example, in the example of FIG. 5 the selected token corresponds to "true", and so the alternative category is "false". The alternative token may correspond to "false". In some implementations, the alternative token that was not selected has a next highest associated probability after the selected token. For example, in the example of FIG. 5 the unselected token having the next highest probability is "false" having associated probability value −3.68752. That said, in general the unselected alternative token having the next highest probability after the selected token does not necessarily need to correspond to another category different from the category to which the selected token corresponds. Or said another way, in general the unselected alternative token corresponding to a different category does not necessarily need to be the token having the next highest probability after the selected token.

In some implementations of the method of FIG. 8, there are only two categories, which are a first category corresponding to the first information being sufficient to reply to the query and a second category corresponding to the first information being insufficient to reply to the query. The response can be one of two response values, where a first response value of the two response values corresponds to the first information being sufficient to reply to the query and the second response value of the two response values corresponds to the first information being insufficient to reply to the query. The response is the first response value corresponding to the first information being sufficient to reply to the query, and the selected token corresponds to the first response value. The alternative token corresponds to the second response value. This is the case in the example of FIG. 5 in which the information is classified as sufficient to reply to the query at 663 by the output \"sufficient_info\": true, and the selected token corresponds to this classification (where the selected token corresponds to "true"). Assuming the alternative token is the unselected token having the next highest probability, the alternative token is "false", which corresponds to the information being classified as insufficient to reply to the query.

In some implementations of the method of FIG. 8, responsive to the confidence value not satisfying the threshold, any of the example actions discussed earlier may be incorporated into the method of FIG. 8. For example, step 750 may include additional actions responsive to the confidence value not satisfying the threshold, such as: prompting the generative language model to generate output explaining what disclosure is missing from the first information to be able to reply to the query; and/or stopping the generative language model from generating further output (because the further output is based on the generative language model classifying the first information as being sufficient to reply to the query, but the first information is deemed to be not sufficient enough); and/or modifying the generative language model output to change the classification (e.g. to change the output to \"sufficient_info\": false, as described above), and continue receiving output from the generative language model with the response modified.

Note that the method of FIG. 8 and its variations/implementations described above are not limited to the RAG example of FIGS. 3 to 6, but apply in any scenario in which a generative language model is being used to classify information. It does not have to be the RAG scenario described earlier in relation to FIGS. 3 to 6, and the generative language model does not necessarily need to classify anything else (e.g. it does not necessarily need to classify a query as ambiguous or unambiguous—there might not even be a query provided as part of the prompt).

Technical benefits of some implementations include the following. Given the machine-learning operation of the generative language model, the output of the generative language model does not represent a definitive statement, but is based on probability computations of the machine learning model. Therefore, the classification of the information as sufficient to reply to the query may be incorrect, which leads to the downstream technical problems discussed earlier. In particular, the generative language model will typically generate additional output based on the classification, and if there is not confidence in the classification the output provided by the generative language model is likely to be hallucination or irrelevant. This can result in additional prompts to the generative language model, which has a material impact, not just because of the additional computation power/operations, but because a generative language model is a precious computing resource often having a token limit and/or a limit on how many prompts can be sent to generative language model. The waste of tokens and/or wasted prompts may lead to slow performance, e.g. due to a delay resulting from a token limit being exceeded. There is also impact on machine-user interaction. However, by determining the confidence value using at least the probability value associated with a token that forms a basis of the response providing the classification, as described above, a confidence in the classification can be determined. If there is not enough confidence in the classification (e.g. the confidence value does not satisfy a threshold), then action may be taken, as described above. The action may mitigate hallucination, e.g. by stopping the subsequent generative language model output and prompting the generative language model to instead provide a reply based on additional information (e.g. from further searching). Tokens and/or prompts are not wasted on hallucinated or irrelevant output. Also, machine-user interaction is improved because the reply to the end user will be improved by dynamically performing the action based on the confidence value. The functioning of the machine-learning based computer system is thereby improved compared to conventional systems in which the machine learning operation would result in hallucination or irrelevant output, leading to wasted tokens and/or wasted prompts and poor machine-user interaction.

Requesting Clarification Relating to a Query

In a scenario in which a reply to a query is to be generated, whether it be in the context of RAG (like in the examples of FIGS. 4 and 5) or otherwise, the query might be ambiguous. The generative language model may be instructed to generate a response classifying the query into one of a plurality of categories related to whether or not the query is ambiguous. Ambiguous may alternatively be called "unclear", and unambiguous may alternatively be called "clear".

In the example prompt 614 in FIG. 5, there are two categories: the query is classified as either unambiguous (\"ambiguous_query\": false) or ambiguous (\"ambiguous_query\": true). In general, there may be other categories (e.g. the generative language model may output one of three indications: ambiguous, unambiguous, or unsure). In a situation in which the generative language model classifies the query as unambiguous (e.g. \"ambiguous_query\": false), a confidence value may be computed that is indicative of confidence in the generative language model's classification. The confidence value may be (or be based on) the probability associated with one or more tokens forming the basis of the response (e.g. the log probability of the token corresponding to "false"). In the example of FIG. 5, the log probability of "false" is −0.00676, and the confidence value may be that value or based on that value. The confidence value might be determined using the probability associated with the selected token ("false", −0.00676) and a probability associated with an alternative token not selected by the generative language model to form the basis of the response (e.g. "true", −4.99972). The confidence value may be determined in any of the ways described earlier.

Upon computing the confidence value, if the confidence value does not satisfy a threshold, then an action may be taken. Examples include actions that are responsive to the query being classified as ambiguous, despite the generative language model classifying the query as unambiguous. The actions may include one or more of the following described earlier in detail above, but summarized as follows:

Obtain a clarification question, e.g. as explained in more detail below.

Prompt the generative language model to generate output explaining why the query is ambiguous and/or asking one or more clarification questions. The prompt might possibly include the generative language model output modified to change the classification, e.g. to change the output to \"ambiguous_query\": true.

Stop the generative language model from generating further output (because the further output is based on the generative language model classifying the query as unambiguous, but the query is deemed to be not unambiguous enough).

Modify the generative language model output to change the classification (e.g. to change the output to \"ambiguous_query\": true, as described above), and continue receiving output from the generative language model with the response modified. Use this output to form the basis of the reply to the query.

If the action is or includes obtaining a clarification question, then this may be implemented in different ways. In one example, the generative language model is provided with a prompt including the query and an instruction to generate one or more clarification questions related to the query. In another example, the generative language model is not utilized to generate a clarification question, but instead a predefined clarification question is retrieved from memory and provided as the reply, e.g. "I do not understand. May you provide more detail?"

In another implementation, before replying with a clarification question (or instead of replying with a clarification question), the query may be used to perform searching and the generative language model may be provided with a prompt having the query and the search results. The prompt may instruct the generative language model to generate a clarification question based on the query and the search results. Alternatively, the prompt may instruct the generative language model to classify the query as either unambiguous or ambiguous given the information in the search results. If classified as unambiguous, the confidence value may be computed as described above, and if it now satisfies the threshold the generative language model may generate an reply/answer to the query.

In some implementations, if one or more clarification questions are provided as a reply and an updated query is received, the updated query may be classified, and assuming the updated query is also classified as unambiguous, the confidence value for that classification may be determined. If the confidence value satisfies the threshold, the reply to the updated query may be provided by the generative language model using the updated query, possibly along with a previous (e.g. the original) query. Otherwise, a possible further clarification question may be returned in reply to the updated query. In a variation, the process of obtaining an updated query, determining the corresponding confidence value, and asking a further clarification question may be iteratively repeated until the confidence value satisfies the threshold that the query is clear and/or until the confidence value reaches a peak or plateaus.

FIG. 9 illustrates a method performed by a computer, e.g. computing device 514, according to one example. At step 772, a prompt is provided to a generative language model. The prompt includes a query, and the prompt instructs the generative language model to generate a response that classifies the query into one of a plurality of categories. The plurality of categories includes a category corresponding to the query being unambiguous. An example is illustrated in FIG. 5 in which prompt 614 includes query 652, and at 654 the prompt instructs the generative language model to generate a response that classifies the query 652 as either ambiguous or unambiguous by outputting either ambiguous_query: true or ambiguous_query: false. In this example, there are two categories (ambiguous_query: true and ambiguous_query: false), and one of the categories (ambiguous_query: false) corresponds to the query being unambiguous.

At step 774, a response is received from the generative language model. The response classifying the query into the category corresponding to the query being unambiguous. The response is based on one or more tokens selected by the generative language model. An example is illustrated in FIG. 5 in which example output 662 includes the response \"ambiguous_query\": false, which classifies the query 652 as unambiguous. The response is based on at least one token that corresponds to the word "false".

At step 776, for a token that forms a basis of the response, the computer (e.g. computing system 514) receives, from the generative language model, a probability value associated with the token. An example is illustrated in FIG. 5 in which the token "false" in the response \"ambiguous_query\": false is associated with a probability value of –0.00676.

At step 778, a confidence value is determined using at least the probability value associated with the token. Continuing the example in FIG. 5, the confidence value may be the probability value associated with the token "false" (i.e. probability value –0.00676), or it may be based on both that probability value and a probability value of an unselected alternative token, e.g. the confidence value may be the difference between the probability value associated with the token "false" (–0.00676) and the probability value associated with the unselected alternative token "true" (–4.99972), i.e. $-0.00676 - -4.99972 = 4.99296$. The confidence value may be computed in any of the ways explained earlier.

The confidence value may be compared to a threshold that, if satisfied, means that there is sufficient confidence in the classification. As explained earlier, "satisfying a threshold" means that the confidence value falls within a particular range associated with high (or high enough or suitably high) confidence, e.g. a range that encompasses all values that exceed the threshold. Therefore, not satisfying the threshold means that the confidence value does not fall within the particular range. Not satisfying the threshold means that there is not high enough confidence in the classification performed by the generative language model. Determining whether the confidence value satisfies the threshold may be implemented by comparing the confidence value to the threshold.

At step 780, responsive to the confidence value not satisfying a threshold, a reply to the query may be provided that requests clarification relating to the query.

In the method of FIG. 9, even though the generative language model classifies the query as unambiguous, because the confidence in the classification is not determined to be high enough (the threshold is not satisfied), rather than reply to answer the query, the reply requests clarification (e.g. asks a clarification question) relating to the query.

In some implementations of the method of FIG. 9, the reply to the query in step 780 may be based on output from the generative language model. For example, in some implementations, the prompt of step 772 is a first prompt, and providing the reply in step 780 may include: providing a second prompt to the generative language model, and providing the reply to the query based on output from the generative language model responsive to the second prompt. For example, it might be the case that after the confidence value is determined to not satisfy the threshold in step 780, a new prompt (referred to as the "second prompt") is formed that includes the query and that instructs the generative language model to generate a clarification question requesting further clarification relating to the query. The second prompt may then be provided to the generative language model, and responsive to the second prompt the generative language model generates output providing the clarification question. The reply may then include the clarification question output from the generative language model.

In some implementations of the method of FIG. 9, the second prompt may indicate, to the generative language model, that the query is classified into another category different from the category into which the query was classified by the response. For example, continuing the example in FIG. 5 in which the query 652 was initially classified as unambiguous (at 662), the second prompt may be: "The query is: How to put a video on page. The query is ambiguous, i.e. it was classified as \"ambiguous_query\": true. Determine what is unclear about the query and generate a clarification question that asks the user for additional information". Note that in this example, the query 652 was actually classified as unambiguous at 662 (i.e. \"ambiguous_query\": false). However, because the confidence value associated with this classification did not satisfy the threshold (at step 780 of FIG. 9), the second prompt indicates that the query was classified as ambiguous.

In some implementations of the method of FIG. 9, the second prompt includes information retrieved based on the query, and the second prompt instructs the generative language model to use the information to generate the reply that requests clarification. For example, continuing the example in FIG. 5 in which the query 652 was initially classified as unambiguous (at 662), the second prompt may be: "The query is: How to put a video on page. The information is: To include a YouTube™ video in a webpage, first go to the YouTube™ video you want to add to your webpage. Then, . . . The query is ambiguous, i.e. it was classified as \"ambiguous_query\": true. Using the information, determine what is unclear about the query and generate a clarification question that asks the user for additional information". Like in the example above, in this example the query 652 was actually classified as unambiguous at 662 (i.e. \"ambiguous_query\": false). However, because the confidence value associated with this classification did not satisfy the threshold (at step 780 of FIG. 9), the second prompt indicates that the query was classified as ambiguous.

In some implementations of the method of FIG. 9, responsive to the confidence value not satisfying the threshold in step 780, the response may be modified to classify the query into another category different from the category into which the query was originally classified by the response. Then generation of output from the generative language model may be continued with the response modified. The reply may then be provided based on the output from the generative language model with the response modified. An example is explained earlier in the description in which the output of the generative language model 532 is modified mid-stream as output 616 is generated responsive to prompt 614 in order to change \"ambiguous_query\": false to \"ambiguous_query\": true. This may cause the generative language model to generate a clarification question, rather than answer the query. The reply may then include the clarification question.

In some implementations of the method of FIG. 9, in step 776 the token that forms the basis of the response is a selected token, and the method further includes receiving, from the generative language model, a probability value associated with an alternative token that was not selected by the generative language model to form the basis of the response. The confidence value may then be determined using the probability value associated with the selected token and the probability value associated with the alternative token. For example, in the example of FIG. 5 the response classifies the query 652 as \"ambiguous_query\": false, as shown at 662. The token that forms the basis of that response performing the classification is the token corresponding "false", i.e. the selected token. It has an associated probability value –0.00676. An alternative token that was not selected includes any of the alternative tokens shown at 664 that were not selected, i.e. "true" having associated probability value –4.99972, "False" having associated probability value –16.907, "True" having associated probability value –23.454, and "\n" having associated probability value –30.225. The confidence value may be determined using the probability value associated with the selected token (–0.00676) and the probability values of one or more of the alternative tokens in any of the ways described earlier. For example, the confidence value may be determined by performing a comparison between the probability value associated with the selected token and the probability value associated with an alternative token. The confidence value may be based on the comparison. For example, the comparison may be computing a difference between the probability value associated with the selected token and the probability value associated with an alternative token (e.g. the difference –0.00676 ––4.99972=4.99296). In another example, the comparison might instead be based on a ratio, e.g. a ratio of the probability of the selected token and the probability of an alternative token, or vice versa.

In some implementations of the method of FIG. 9, the alternative token that was not selected corresponds to another category of the plurality of categories. For example, in the example of FIG. 5 the selected token corresponds to "false", and so the alternative category is "true". The alternative token may correspond to "true". In some implementations, the alternative token that was not selected has a next highest associated probability after the selected token. For example, in the example of FIG. 5 the unselected alternative token having the next highest probability is "true" having associated probability value –4.99972. That said, in general the unselected alternative token having the next highest probability after the selected token does not necessarily need to correspond to another category different from the category to which the selected token corresponds. Or said another way, in general the unselected alternative token corresponding to a different category does not necessarily need to be the token having the next highest probability after the selected token.

In some implementations of the method of FIG. 9, there are only two categories, which are a first category corresponding to the query being unambiguous and a second category corresponding to the query being ambiguous. The response can be one of two response values, where a first response value of the two response values corresponds to the query being unambiguous and the second response value of the two response values corresponds to the query being ambiguous. The response is the first response value corresponding to the query being unambiguous, and the selected token corresponds to the first response value. The alternative token corresponds to the second response value. This is the case in the example of FIG. 5 in which the query is classified as unambiguous at 662 by the output \"ambiguous_query\": false, and the selected token corresponds to this classification (where the selected token corresponds to "false"). Assuming the alternative token is the unselected token having the next highest probability, the alternative token is "true", which corresponds to the query being classified as ambiguous.

In some implementations of the method of FIG. 9, responsive to the confidence value not satisfying the threshold, any of the example actions discussed earlier may be incorporated into the method of FIG. 9. For example, step 780 may include additional actions responsive to the confidence value not satisfying the threshold, such as: obtaining a clarification question; and/or prompting the generative language model to generate output explaining why the query is ambiguous and/or asking one or more clarification questions (where the prompt might possibly include the generative language model output modified to change the classification, e.g. to change the output to \"ambiguous_query\": true); and/or stopping the generative language model from generating further output (because the further output is based on the generative language model classifying the query as unambiguous, but the query is deemed to be not unambiguous enough); and/or modifying the generative language model output to change the classification (e.g. to change the output to \"ambiguous_query\": true, as described above), and continue receiving output from the generative language model with the response modified.

Note that the method of FIG. 9 and its variations/implementations described above are not limited to the RAG example of FIGS. 3 to 6, but apply in any scenario in which a generative language model is being used to classify a query. It does not have to be the RAG scenario described earlier in relation to FIGS. 3 to 6, and the generative language model does not necessarily need to classify anything else (e.g. it does not necessarily need to classify whether information is sufficient to reply to the query—there might not even be such information provided as part of the prompt).

Technical benefits of some implementations include the following. Given the machine-learning operation of the generative language model, the output of the generative language model does not represent a definitive statement, but is based on probability computations of the machine learning model. Therefore, the classification of the query as unambiguous may be incorrect, which leads to the downstream technical problems discussed earlier. In particular, the generative language model will typically generate additional output based on the classification, and if there is not confidence in the classification the output provided by the generative language model is likely to be hallucination or irrelevant. This can result in additional prompts to the generative language model, which has a material impact, not just because of the additional computation power/operations, but because a generative language model is a precious computing resource often having a token limit and/or a limit on how many prompts can be sent to generative language model. The waste of tokens and/or wasted prompts may lead to slow performance, e.g. due to a delay resulting from a token limit being exceeded. There is also impact on machine-user interaction. However, by determining the confidence value using at least the probability value associated with a token that forms a basis of the response providing the classification, as described above, a confidence in the classification can be determined. If there is not enough confidence in the classification (e.g. the confidence value does not satisfy a threshold), then action may be taken, as described above. The action may mitigate hallucination, e.g. by stopping the subsequent generative language model output and prompting the generative language model to instead provide a clarification question, or by modifying the generative language model output mid-stream to change the classification from "unambiguous" to "ambiguous", as explained earlier. Tokens and/or prompts are not wasted on hallucinated or irrelevant output. Also, machine-user interaction is improved because the reply to the end user will be improved by dynamically performing the action based on the confidence value. The functioning of the machine-learning based computer system is thereby improved compared to conventional systems in which the machine learning operation would result in hallucination or irrelevant output, leading to wasted tokens and/or wasted prompts and poor machine-user interaction.

Additional Variations

In a situation in which a generative language model is prompted to classify whether a query is ambiguous and/or classify whether retrieved information is sufficient (like in the example in FIG. 5), there is a technical benefit to prompting the generative language model to output the classification before providing further output such as an answer. This is because the tokens generated by a generative language model are highly influenced by the preceding sequence of tokens, and so the accuracy of the values (e.g. True/False) of the ambiguous_query and sufficient_info fields is higher when the generative language model is instructed to output these fields before generating any other text. If generated after the answer, the generative language model may almost always indicate that the query is not ambiguous (and the information was sufficient), because the generative language model generated a passage of text in response to the prompt. It is advantageous to prompt the true or false response before a text answer for several reasons. The probabilities after the generative language model has output something may indicate a high level of confidence in the answer that is not necessarily reflective of the true confidence. This may be because the generative language model has already generated a passage of text in response to the prompt, which it may view as being associated with having sufficient information and a clear query because it was able to provide the text. Second, if the probabilities of the token generated at the specific position being evaluated indicate lack of input or errors of some kind, an early exit of the generative language model generation/completion can be performed. Thus, resources are not wasted in generating the following incorrect or misinformed text (which may be hallucination). This may be done by evaluating the probabilities on the same system as they are generated, or across an API as data is streamed from one system to another.

In some implementations, when replying to a query based on retrieved information (e.g. in the method of FIG. 8), the generative language model may be instructed to reference, in the reply, passages from the retrieved information that are relied upon to reply to the query.

In some implementations, a grammar may be used to constrain the response to one of the acceptable categories, so that the top log probabilities always correspond to tokens that correspond to an acceptable category. This may also save bandwidth by needing to return fewer top log probabilities.

In some implementations, the generative language model may be configured to bias certain tokens ("a logit bias"), e.g. to bias the probability of the token "false" compared to "true", which may be useful to bias the generative language model to be more conservative in its classification (e.g. biasing going back to the user asking a clarification question).

In some implementations, the probabilities are generated on a CPU or GPU (e.g. that implements the generative language model), while the evaluating of those probabilities at a specific position in the generation and making a determination may occur on the same CPU or GPU or on a distributed system architecture that receives a stream of output via an API. The distributed system may receive the stream of generated text and its probabilities over an API and make a determination, or it may set what position and what tokens and probabilities to evaluate via an API, receiving a processed determination as a response rather than raw probabilities.

CONCLUSION

Note that the expression "at least one of A or B", as used herein, is interchangeable with the expression "A and/or B". It refers to a list in which you may select A or B or both A and B. Similarly, "at least one of A, B, or C", as used herein, is interchangeable with "A and/or B and/or C" or "A, B, and/or C". It refers to a list in which you may select: A or B or C, or both A and B, or both A and C, or both B and C, or all of A, B and C. The same principle applies for longer lists having a same format.

The scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Any module, component, or device exemplified herein that executes instructions may include or otherwise have access to a non-transitory computer/processor readable storage medium or media for storage of information, such as computer/processor readable instructions, data structures, program modules, and/or other data. A non-exhaustive list of examples of non-transitory computer/processor readable storage media includes magnetic cassettes, magnetic tape, magnetic disk storage or other magnetic storage devices, optical disks such as compact disc read-only memory (CD-ROM), digital video discs or digital versatile disc (DVDs), Blu-ray Disc™, or other optical storage, volatile and non-volatile, removable and non-removable media implemented in any method or technology, random-access memory (RAM), read-only memory (ROM), electrically erasable programmable read-only memory (EEPROM), flash memory or other memory technology. Any such non-transitory computer/processor storage media may be part of a device or accessible or connectable thereto. Any application or module herein described may be implemented using computer/processor readable/executable instructions that may be stored or otherwise held by such non-transitory computer/processor readable storage media.

Memory, as used herein, may refer to memory that is persistent (e.g. read-only-memory (ROM) or a disk), or memory that is volatile (e.g. random access memory (RAM)). The memory may be distributed, e.g. a same memory may be distributed over one or more servers or locations.

The invention claimed is:

1. A computer-implemented method comprising:

providing a prompt to a generative language model, the prompt including a query and the prompt instructing the generative language model to generate a response that classifies the query into one of a plurality of categories, wherein the plurality of categories includes a category corresponding to the query being unambiguous;

receiving the response from the generative language model, the response classifying the query into the category corresponding to the query being unambiguous, and the response being based on one or more tokens selected by the generative language model;

for a token that forms a basis of language indicating the query is unambiguous: receiving, from the generative language model, a probability value associated with the token that forms the basis of language indicating the query is unambiguous;

determining a confidence value using at least the probability value associated with the token that forms the basis of language indicating the query is unambiguous; and responsive to the confidence value not satisfying a threshold, providing a reply to the query that requests clarification relating to the query.

2. The computer-implemented method of claim 1, wherein the reply to the query is based on output from the generative language model.

3. The computer-implemented method of claim 2, wherein the prompt is a first prompt, and wherein providing the reply comprises:

providing a second prompt to the generative language model; and providing the reply to the query based on output from the generative language model responsive to the second prompt.

4. The computer-implemented method of claim 3, wherein the second prompt indicates, to the generative language model, that the query is classified into another category different from the category into which the query was classified by the response.

5. The computer-implemented method of claim 3, wherein the second prompt includes information retrieved based on the query, and the second prompt instructs the generative language model to use the information to generate the reply that requests clarification.

6. The computer-implemented method of claim 2, wherein:

responsive to the confidence value not satisfying the threshold, modifying the response to classify the query into another category different from the category into which the query was originally classified by the response;

continuing generation of output from the generative language model with the response modified; and providing the reply based on the output from the generative language model with the response modified.

7. The computer-implemented method of claim 1, wherein the token that forms the basis of language indicating the query is unambiguous is a selected token, wherein the method further comprises receiving, from the generative language model, a probability value associated with an alternative token that was not selected by the generative language model to form the basis of language indicating the query is unambiguous, and wherein the confidence value is determined using the probability value associated with the selected token and the probability value associated with the alternative token.

8. The computer-implemented method of claim 7, wherein the alternative token that was not selected corresponds to another category of the plurality of categories.

9. The computer-implemented method of claim 7, wherein the alternative token that was not selected has a next highest associated probability after the selected token.

10. The computer-implemented method of claim 7, wherein there are only two categories, the two categories being a first category corresponding to the query being unambiguous and a second category corresponding to the query being ambiguous, wherein the response can be one of two response values, wherein a first response value of the two response values corresponds to the query being unambiguous and the second response value of the two response values corresponds to the query being ambiguous, wherein the response is the first response value corresponding to the query being unambiguous, wherein the selected token corresponds to the first response value, and wherein the alternative token corresponds to the second response value.

11. The computer-implemented method of claim 7, wherein determining the confidence value comprises performing a comparison between the probability value associated with the selected token and the probability value associated with the alternative token, and wherein the confidence value is based on the comparison.

12. A system comprising:

at least one processor; and a memory storing processor-executable instructions that, when executed by the at least one processor, cause the system to:

provide a prompt to a generative language model, the prompt including a query and the prompt instructing the generative language model to generate a response that classifies the query into one of a plurality of categories, wherein the plurality of categories includes a category corresponding to the query being unambiguous;

receive the response from the generative language model, the response classifying the query into the category corresponding to the query being unambiguous, and the response being based on one or more tokens selected by the generative language model;

for a token that forms a basis of language indicating the query is unambiguous: receive, from the generative language model, a probability value associated with the token that forms the basis of language indicating the query is unambiguous;

determine a confidence value using at least the probability value associated with the token that forms the basis of language indicating the query is unambiguous; and responsive to the confidence value not satisfying a threshold, provide a reply to the query that requests clarification relating to the query.

13. The system of claim 12, wherein the reply to the query is based on output from the generative language model.

14. The system of claim 13, wherein the prompt is a first prompt, and wherein providing the reply comprises:

providing a second prompt to the generative language model; and providing the reply to the query based on output from the generative language model responsive to the second prompt.

15. The system of claim 14, wherein the second prompt indicates, to the generative language model, that the query is classified into another category different from the category into which the query was classified by the response.

16. The system of claim 14, wherein the second prompt includes information retrieved based on the query, and the second prompt instructs the generative language model to use the information to generate the reply that requests clarification.

17. The system of claim 12, wherein the token that forms the basis of language indicating the query is unambiguous is a selected token, wherein the instructions, when executed, further cause the system to receive, from the generative language model, a probability value associated with an alternative token that was not selected by the generative language model to form the basis of language indicating the query is unambiguous, and wherein the confidence value is determined using the probability value associated with the selected token and the probability value associated with the alternative token.

18. The system of claim 17, wherein there are only two categories, the two categories being a first category corresponding to the query being unambiguous and a second category corresponding to the query being ambiguous, wherein the response can be one of two response values, wherein a first response value of the two response values corresponds to the query being unambiguous and the second response value of the two response values corresponds to the query being ambiguous, wherein the response is the first response value corresponding to the query being unambiguous, wherein the selected token corresponds to the first response value, and wherein the alternative token corresponds to the second response value.

19. The system of claim 17, wherein determining the confidence value comprises performing a comparison between the probability value associated with the selected token and the probability value associated with the alternative token, and wherein the confidence value is based on the comparison.

20. A non-transitory computer readable medium having stored thereon computer-executable instructions that, when executed by a computer, cause the computer to perform operations comprising:

providing a prompt to a generative language model, the prompt including a query and the prompt instructing the generative language model to generate a response that classifies the query into one of a plurality of categories, wherein the plurality of categories includes a category corresponding to the query being unambiguous;

receiving the response from the generative language model, the response classifying the query into the category corresponding to the query being unambiguous, and the response being based on one or more tokens selected by the generative language model;

for a token that forms a basis of language indicating the query is unambiguous: receiving, from the generative language model, a probability value associated with the token that forms the basis of language indicating the query is unambiguous;

determining a confidence value using at least the probability value associated with the token that forms the basis of language indicating the query is unambiguous; and responsive to the confidence value not satisfying a threshold, providing a reply to the query that requests clarification relating to the query.

*    *    *    *    *